(12) United States Patent
Kiuchi

(10) Patent No.: US 9,494,654 B2
(45) Date of Patent: Nov. 15, 2016

(54) SEMICONDUCTOR DEVICE, BATTERY STATE MONITORING MODULE, AND VEHICLE SYSTEM

(71) Applicant: Renesas Electronics Corporation, Kawasaki-shi (JP)

(72) Inventor: Hideki Kiuchi, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 310 days.

(21) Appl. No.: 13/888,280

(22) Filed: May 6, 2013

(65) Prior Publication Data

US 2013/0325303 A1    Dec. 5, 2013

(30) Foreign Application Priority Data

May 31, 2012    (JP) .................. 2012-125211

(51) Int. Cl.
G01R 31/36     (2006.01)
F02N 11/08     (2006.01)
G01R 31/02     (2006.01)

(52) U.S. Cl.
CPC ....... G01R 31/3624 (2013.01); F02N 11/0825 (2013.01); G01R 31/025 (2013.01); G01R 31/3631 (2013.01); G01R 31/3637 (2013.01); G01R 31/3658 (2013.01); G01R 31/3693 (2013.01); G01R 31/3606 (2013.01); G01R 31/3648 (2013.01)

(58) Field of Classification Search
CPC ............... G01R 31/36; G01R 31/3606; G01R 31/3624;G01R 31/3634; G01R 31/3637; G01R 31/3679; G01R 31/3693; G01R 31/3696; F02N 11/0825; F02N 2200/06; F02N 2200/061; F02N 2200/062; F02N 2200/063; F02N 2200/064
See application file for complete search history.

(56) References Cited

U.S. PATENT DOCUMENTS

| | | | | |
|---|---|---|---|---|
| 4,528,955 A | * | 7/1985 | Sugiura | F02P 5/1526 123/406.37 |
| 5,137,020 A | * | 8/1992 | Wayne | A61N 1/3708 607/29 |
| 5,254,951 A | * | 10/1993 | Goto | G01R 31/3606 320/134 |
| 5,721,688 A | * | 2/1998 | Bramwell | H02J 7/0093 320/128 |

(Continued)

FOREIGN PATENT DOCUMENTS

JP    2010-249793 A    11/2010

*Primary Examiner* — Hung Q Nguyen
*Assistant Examiner* — Kevin R Steckbauer
(74) *Attorney, Agent, or Firm* — McGinn IP Law Group, PLLC

(57) ABSTRACT

A semiconductor device has a first and a second external terminals coupled to power supply wiring that couples one end of a current detecting resistance and a power supply terminal of a battery, a third external terminal coupled to an other end of the current detecting resistance, and a control circuit for controlling an output of a second measurement current destined to the third external terminal, and measures a voltage difference between the first external terminal and the second external terminal.

17 Claims, 19 Drawing Sheets

(56) References Cited

U.S. PATENT DOCUMENTS

| | | | | |
|---|---|---|---|---|
| 5,862,515 A * | 1/1999 | Kobayashi | G01R 31/3662 | 324/428 |
| 6,140,928 A * | 10/2000 | Shibuya | G01R 31/3655 | 320/134 |
| 6,249,106 B1 * | 6/2001 | Turner | H02J 7/0032 | 320/136 |
| 6,331,762 B1 * | 12/2001 | Bertness | G01R 31/3627 | 320/134 |
| 6,392,414 B2 * | 5/2002 | Bertness | G01R 31/36 | 324/429 |
| 6,633,165 B2 * | 10/2003 | Bertness | G01R 31/3624 | 320/134 |
| 6,806,716 B2 * | 10/2004 | Bertness | G01R 31/3655 | 324/426 |
| 6,850,037 B2 * | 2/2005 | Bertness | G01R 31/36 | 320/132 |
| 6,885,167 B2 * | 4/2005 | Palanisamy | G01R 31/3693 | 320/104 |
| 7,126,341 B2 * | 10/2006 | Bertness | G01R 31/3624 | 324/426 |
| 7,705,602 B2 * | 4/2010 | Bertness | G01R 31/007 | 320/104 |
| 7,902,828 B2 * | 3/2011 | Huang | G01R 31/3662 | 324/430 |
| 7,928,735 B2 * | 4/2011 | Huang | B60L 11/1857 | 320/132 |
| 7,999,554 B2 * | 8/2011 | Bucur | H01M 2/1016 | 320/112 |
| 8,036,839 B2 * | 10/2011 | Machiyama | B60L 11/1861 | 320/136 |
| 8,154,253 B2 * | 4/2012 | Omagari | G01R 31/3624 | 320/116 |
| 8,378,638 B2 * | 2/2013 | Majima | G01R 31/3624 | 320/132 |
| 8,841,915 B2 * | 9/2014 | Mizoguchi | G01R 31/3658 | 324/426 |
| 8,901,891 B2 * | 12/2014 | Inoue | G01R 19/14 | 320/132 |
| 9,128,164 B2 * | 9/2015 | Mizoguchi | G01R 31/3658 | |
| 9,300,155 B2 * | 3/2016 | Mizoguchi | H02J 7/0063 | |
| 9,340,122 B2 * | 5/2016 | Yamauchi | B60L 11/1866 | |
| 2010/0244847 A1 | 9/2010 | Kudo et al. | | |
| 2011/0193413 A1 * | 8/2011 | Kudo | H02J 7/0018 | 307/77 |
| 2011/0265025 A1 * | 10/2011 | Bertness | G01R 31/006 | 715/771 |
| 2012/0194135 A1 * | 8/2012 | Mizoguchi | H02J 7/0016 | 320/118 |
| 2012/0194199 A1 * | 8/2012 | Mizoguchi | G01R 31/3658 | 324/433 |
| 2012/0221266 A1 * | 8/2012 | Kuroda | G01R 31/40 | 702/63 |
| 2013/0026994 A1 * | 1/2013 | Morikawa | G01R 31/3658 | 320/134 |
| 2013/0085657 A1 * | 4/2013 | Bito | F02N 11/0825 | 701/112 |
| 2013/0099747 A1 * | 4/2013 | Baba | H02J 7/0019 | 320/118 |
| 2014/0225622 A1 * | 8/2014 | Kudo | B60L 3/0046 | 324/433 |
| 2016/0061909 A1 * | 3/2016 | Iino | G01R 31/3679 | 324/432 |
| 2016/0072282 A1 * | 3/2016 | Kumagai | H02J 7/0014 | 307/10.1 |

\* cited by examiner

CURRENT MONITORING OPERATION
(IN THE CASE OF SHORT CIRCUIT BETWEEN TERMINALS)

SEMICONDUCTOR DEVICE, BATTERY STATE MONITORING MODULE, AND VEHICLE SYSTEM

CROSS-REFERENCE TO RELATED APPLICATIONS

The disclosure of Japanese Patent Application No. 2012-125211 filed on May 31, 2012 including the specification, drawings and abstract is incorporated herein by reference in its entirety.

BACKGROUND

The present invention relates to a semiconductor device, a battery state monitoring module, and a vehicle system, for example, to a semiconductor device for measuring a charge-discharge current of the battery based on a voltage difference that occurs between two ends of a current detecting resistance having a low resistance, a battery state monitoring module, and a vehicle system.

In the automobile, electric power used for engine start or various controls is provided by a battery. The storage battery is used for the battery carried on the automobile. The battery is charged by an alternator for generating electricity with an engine power. This battery has a feature that its characteristics deteriorate according to its duration of use. For example, the battery has a characteristic that as the duration of use becomes longer, a storage capacity falls, and an output impedance increases, and if such performance deterioration occurs, a problem that the vehicle does not operate normally will be arisen. Therefore, it is necessary to calculate a life of the battery based on a state of the battery, and to judge whether the battery satisfies required performance. Then, a technology of performing a voltage measurement of the battery that is one index of the performance of the battery is disclosed in Japanese Unexamined Patent Application Publication No. 2010-249793. In Japanese Unexamined Patent Application Publication No. 2010-249793, a voltage of each cell of multiple battery cells that are included in an assembled battery as a battery is measured. Here, Japanese Unexamined Patent Application Publication No. 2010-249793 is characterized in that a battery monitor device diagnoses whether a battery state detection circuit for detecting a battery state of a battery cell is operating normally by inputting pseudo voltage information to the battery state detection circuit based on the cell voltage. By Japanese Unexamined Patent Application Publication No. 2010-249793, reliability of a cell voltage measurement system can be improved by diagnosing the battery state detection circuit.

SUMMARY

In recent years, based on a current monitor voltage value occurring between two ends of a current detecting resistance having a small resistance value, a battery state monitoring system for measuring a current flowing through the current detecting resistance is proposed. In such a battery state monitoring system, since a resistance value of the current detecting resistance is very close to a wiring resistance, there is a problem that it is difficult to detect the short circuit state between two terminals coupled to two ends of the current detecting resistance.

Incidentally, Japanese Unexamined Patent Application Publication No. 2010-249793 relates to a measurement system based on a voltage value of a battery cell that has a predetermined cell voltage, and is incapable of detecting a short circuit between two terminals coupled with a current detecting resistance of a small resistance value.

Other problems and new features will become clear from a statement and accompanying drawings of this description.

According to one embodiment, a semiconductor device has a first and a second external terminals that are coupled to power supply wiring that couples one end of the current detecting resistance and the power supply terminal of the battery, a third external terminal coupled to an other end of the current detecting resistance, and a control circuit for controlling an output of a second measurement current destined to the third external terminal, and measures a voltage difference between the first external terminal and the second external terminal.

According to the one embodiment, it is possible to detect a short circuit state between two terminals that are coupled with a current detecting resistance having a very small resistance value.

DETAILED DESCRIPTION

First Embodiment

Hereinafter, with reference to drawings, embodiments will be explained. First, a semiconductor device 1 according to a first embodiment measures a current monitor voltage value that occurs between two ends of a current detecting resistance having a very small resistance value almost of the same amount as a wiring resistance. Then, the semiconductor device 1 according to the first embodiment has a function of detecting existence of short circuit between two external terminals to which it is coupled through the current detecting resistance.

Figure 1:
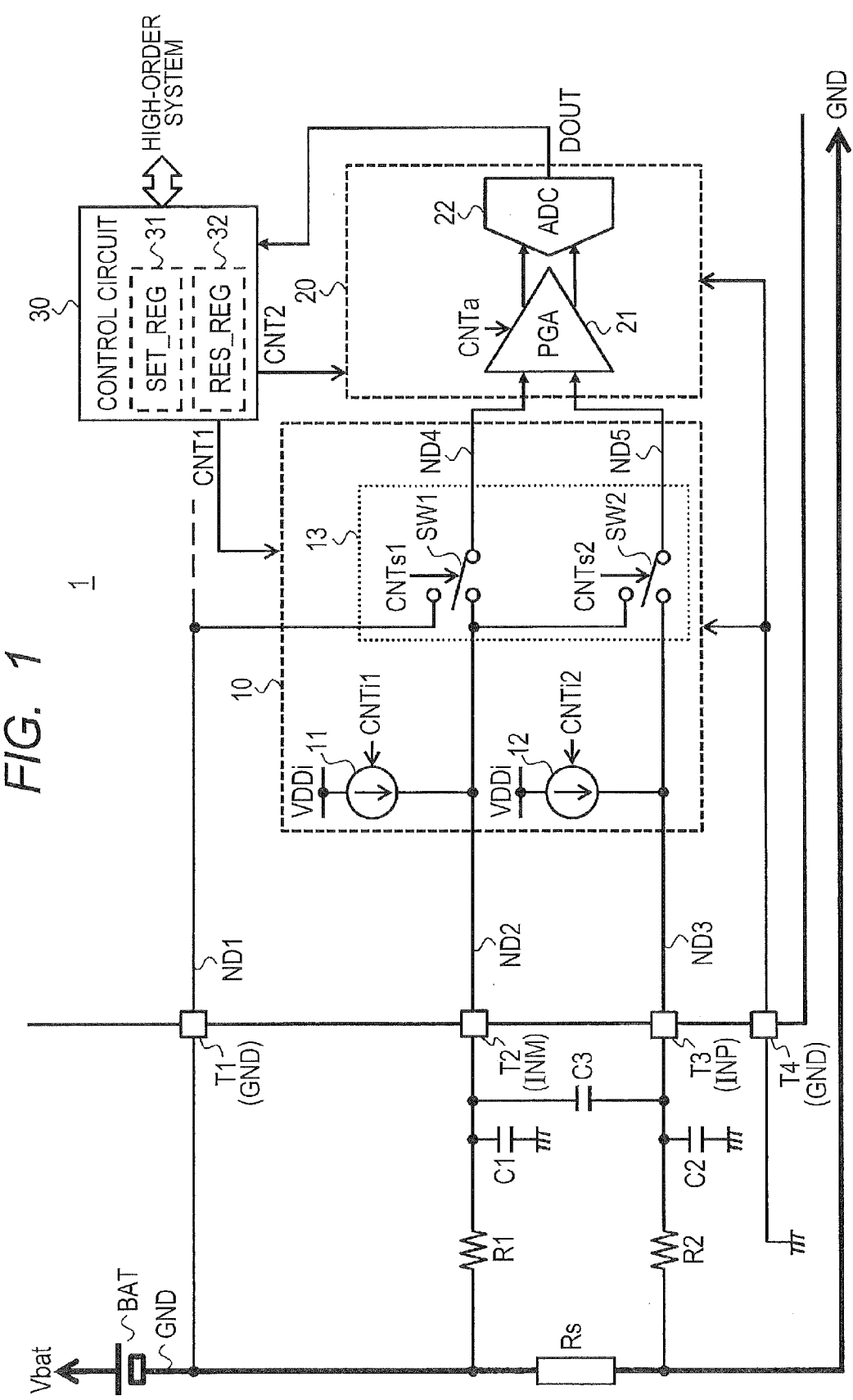
FIG. 1 is a block diagram of a battery state monitoring device according to a first aspect of the present invention.

FIG. 1 is a block diagram of the semiconductor device 1 according to the first embodiment. Incidentally, over the semiconductor device 1, circuits other than an input control circuit 10, a measurement part 20, and a control circuit 30 that will be described later are also mounted. Moreover, FIG. 1 shows a battery BAT that the semiconductor device 1 designates as a measurement object and a current detecting resistance RS for converting a current value of a current that is inputted and outputted to/from the battery BAT into a voltage value. Furthermore, FIG. 1 shows resistances R1, R2 and capacitors C1 to C3. The resistances R1, R2 and the capacitors C1 to C3 function as a filter for eliminating an unnecessary noise when measuring the value of the current monitor voltage that occurs on two ends of the current detecting resistance RS.

Incidentally, the battery BAT is a storage battery carried on a vehicle, for example, an automobile etc., and is a lead battery that contains lead in its electrode material. That is, the battery BAT is one that generates a voltage of 12 V or 24 V, and is different from the nickel metal hydride battery or lithium ion battery used for an assembled battery for supplying electric power to a drive motor of a hybrid automobile or an electric automobile.

Moreover, the current detecting resistance RS is, for example, a shunt resistance and has a very small resistance value close to the wiring resistance (e.g., about 0.1 mΩ). This shunt resistance is, for example, a metal plate whose principal component is copper, and its resistance value is set with high precision. The lead battery is characteristic in that a variation width of its output current is as much large as, for example, 0 A to 1500 A, and when measuring a current having such a large variation width, a current detection element that uses a Hall element etc. cannot measure the whole range of the variation width accurately. On the other hand, since the shunt resistance has a substantially infinite dynamic range, it is suitable to measure the current value having a large variation width like this.

As shown in FIG. 1, the semiconductor device 1 according to the first embodiment has a first external terminal T1, a second external terminal T2, a third external terminal T3, a fourth external terminal T4, the input control circuit 10, the measurement part 20, the control circuit 30, first internal wiring ND1, second internal wiring ND2, third internal wiring ND3, fourth internal wiring ND4, and fifth internal wiring ND5.

Moreover, as shown in FIG. 1, the battery BAT has an anode electrode and a cathode electrode as power supply terminals. Then, the battery BAT outputs a battery voltage Vbat from the anode electrode, and outputs a ground voltage GND from the cathode electrode. Moreover, power supply wiring is coupled to the anode electrode and the cathode electrode, respectively. Then, a current measurement resistance (e.g., the shunt resistance RS) is inserted into the power supply wiring on the cathode electrode side. Incidentally, in the following explanation, a reference symbol of GND is used also to the power supply wiring for transferring the ground voltage GND.

The first external terminal T1 and the second external terminal T2 are coupled to power supply wiring GND that couples one end of the shunt resistance RS and the power supply terminal of the battery. The third external terminal T3 is coupled to an other end of the shunt resistance RS. The fourth external terminal T4 is coupled to ground power supply wiring, giving the ground voltage GND to a circuit in the semiconductor device 1.

Moreover, a first resistance (e.g., the resistance R1) is inserted between the second external terminal T2 and the one end of the shunt resistance RS. A second resistance (e.g., the resistance R2) is inserted between the third external terminal T3 and the other end of the shunt resistance RS. Furthermore, the capacitor C1 is coupled between a node that couples the resistance R1 and the second external terminal T2 and a ground power supply node. The capacitor C2 is coupled between a node that couples the resistance R2 and the third external terminal T3 and the ground power supply node. The capacitor C3 is coupled between the node that couples the resistance R1 and the second external terminal T2 and the node that couples the resistance R2 and the third external terminal T3. The resistances R1, R2 and the capacitors C1 to C3 form a filter circuit.

Moreover, the first internal wiring ND1 is coupled to the first external terminal T1. The second internal wiring ND2 is coupled to the second external terminal T2. The third internal wiring ND3 is coupled to the third external terminal T3. In the semiconductor device 1 according to the first embodiment, a voltage that occurs between the external terminals is transferred to circuits in the semiconductor device by the first internal wiring ND1 to the third internal wiring ND3.

The input control circuit 10 switches a communication route of the voltage to be given to the measurement part 20 in response to a control signal CNT1 that the control circuit 30 outputs, and also performs an output operation of the measurement current during a short-circuit test operation. The input control circuit 10 has a first current source 11, a second current source 12, and a route switching circuit 13.

The first current source 11 outputs a first measurement current to the second external terminal. Moreover, the first current source 11 switches a magnitude of the first measurement current in response to a current control signal CNTi1 included in the control signal CNT1. In this embodiment, the first current source 11 switches whether the first measurement current is outputted according to a value of the current control signal CNTi1. The second current source 12 outputs a second measurement current to the third external terminal. Moreover, the second current source a12 switches a magnitude of its current in response to a current control signal CNTi2 included in a control signal CNT2. In this embodiment, the second current source 12 switches two mode as to whether the second measurement current is outputted according to a value of the current control signal CNTi2.

Incidentally, the first current source 11 and the second current source 12 each have, for example, a current mirror circuit that folds back a reference current generated in a reference current source that is not illustrated and gives it to the second internal wiring ND2 and the third internal wiring ND3. In addition, the first current source 11 and the second current source 12 are each provided with a switching circuit between a transistor coupled to either the second internal wiring ND2 or the third internal wiring ND3 among transistors included in the each current mirror circuit and either the second internal wiring ND2 or the third internal wiring ND3, and switch the open and the closed states of the measurement currents by switching open/close states of the switching circuits based on the current control signals CNTi1, CNTi2. Moreover, output and stop of the measurement current can be switched also by providing a switching circuit between a gate of a transistor that forms the current mirror circuit and the power supply wiring and switching the open and the closed states of the switching circuit based on the current control signals CNTi1, CNTi2.

Moreover, the first measurement current that the first current source 11 outputs is given to the resistance R1 through the second internal wiring ND2. The second measurement current that the second current source 12 outputs is given to the resistance R2 through the third internal wiring ND3.

The route switching circuit 13 switches two coupling states: a coupling state where the first internal wiring ND1 and the second internal wiring ND2 are coupled with the fourth internal wiring ND4 and the fifth internal wiring ND5, respectively; and a coupling state where the second internal wiring ND2 and the third internal wiring ND3 are coupled with the fourth internal wiring ND4 and the fifth internal wiring ND5, respectively. Incidentally, the fourth internal wiring ND4 and the fifth internal wiring ND5 are wiring coupled to the measurement part 20.

The route switching circuit 13 has a first switching circuit SW1 and a second switching circuit SW2. In a first and a second short-circuit test operations during the short-circuit test operation, the first switching circuit SW1 couples the first internal wiring ND1 and the fourth internal wiring ND4; in the current monitor operation, it couples the second internal wiring ND2 and the fourth internal wiring ND4. In the first and the second short-circuit test operations during the short-circuit test operation, the second switching circuit SW2 couples the second internal wiring ND2 and the fifth internal wiring ND5; in the current monitor operation, it couples the third internal wiring ND3 and the fifth internal wiring ND5. The route switching circuit 13 performs the above-mentioned route switching operation in response to switch control signals CNTs1, CNTs2 included in the control signal CNT1 that the control circuit 30 outputs.

The measurement part 20 measures a voltage difference between the first external terminal T1 and the second external terminal T2. Incidentally, in the short-circuit test operation, the measurement part 20 outputs the measured value corresponding to the voltage difference between the first external terminal T1 and the second external terminal T2; in a current monitoring operation, it outputs the measured value corresponding to a voltage difference between the second external terminal T2 and the third external terminal T3.

Moreover, the measurement part 20 has a variable gain amplifier 21 and an analog-digital converter 22. The variable gain amplifier 21 amplifies a voltage difference inputted through the fourth internal wiring ND4 and the fifth internal wiring ND5. Moreover, the variable gain amplifier 21 alters its amplification factor by a gain control signal CNTa included in the control signal CNT2 outputted from the control circuit 30.

The analog-digital converter 22 converts, an output value of the variable gain amplifier 21 into a digital value. This digital value is outputted as a measured value DOUT, and is stored in a measured value register 32 of the control circuit 30.

The control circuit 30 makes the semiconductor device 1 perform the current monitoring operation and the short-circuit test operation based on an instruction from a high-order system. Moreover, the control circuit 30 memorizes detection results of the current monitoring operation and the short-circuit test operation, and outputs measurement results that were stored at a request from the high-order system.

The control circuit 30 controls an output of the second measurement current destined to the third external terminal T3. The control circuit 30 has an operating state setting register and the measured value register 32. A setup value that specifies the operating state of the semiconductor device 1 is stored in the operating state setting register 31. The measured value outputted by the measurement part 20 is stored in the measured value register 32 for every operating state. Then, the control circuit 30 switches the short-circuit test operation and the current monitoring operation based on the setup value stored in the operating state setting register 31. Moreover, the semiconductor device 1 performs the first short-circuit test operation in a first period and performs the second short-circuit test operation in a second period in the short-circuit test operation, and the control circuit 30 switches the first short-circuit test operation and the second short-circuit test operation, for example, by a built-in sequencer. Moreover, the control circuit 30 outputs the measured value stored in the measured value register 32 at a request from the high-order system.

Incidentally, the setup value stored in the operating state setting register 31 is rewritten at a request from the high-order system. Then, according to a fact that the setup value of the operating state setting register 31 has been rewritten, the control circuit 30 performs the short-circuit test operation and the current monitoring operation.

The control circuit 30 controls the first current source and the second current source 12 so that a current difference of the first measurement current and the second measurement current may be different between in the first short-circuit test operation and in the second short-circuit test operation. In the first embodiment, during the first period when the first short-circuit test operation is performed, the control circuit 30 makes the second measurement current smaller than the first measurement current; during the second period when the second short-circuit test operation is performed, it makes a magnitude of the second measurement current smaller than that of the first period. More specifically, the control circuit 30 makes the first current source output the first measurement current and stops the output of the second measurement current by the second current source in the first short-circuit test operation of the short-circuit test operation, and makes the first and the second current sources output the first and the second measurement currents, respectively, in the second short-circuit test operation. Moreover, in the short-circuit test operation, the control circuit 30 makes the first switching circuit SW1 couple the first internal wiring ND1 and the fourth internal wiring ND4, and makes the second switching circuit SW2 couple the second internal wiring ND2 and the fifth internal wiring ND5.

In the current monitoring operation, the control circuit 30 controls the first current source 11 and the second current source 12 so that outputs of the measurement currents by the first current source 11 and by the second current source 12 may be intercepted. Moreover, in the current monitoring operation, the control circuit 30 makes the first switching circuit SW1 couple the second internal wiring ND2 and the fourth internal wiring ND4, and makes the second switching circuit SW2 couple the third internal wiring ND3 and the fifth internal wiring ND5.

Following this, an operation of the semiconductor device 1 according to the first embodiment will be explained. The semiconductor device 1 performs the current monitoring operation and the short-circuit test operation. Then, in the following, the operation of the semiconductor device 1 is divided into the current monitoring operation and the short-circuit test operation and these will be explained. Here, in the following explanation, the explanation is performed supposing that a resistance value of the shunt resistance RS is 0.1 mΩ and resistance values of the resistances R1, R2 are 2 kΩ.

Figure 2:
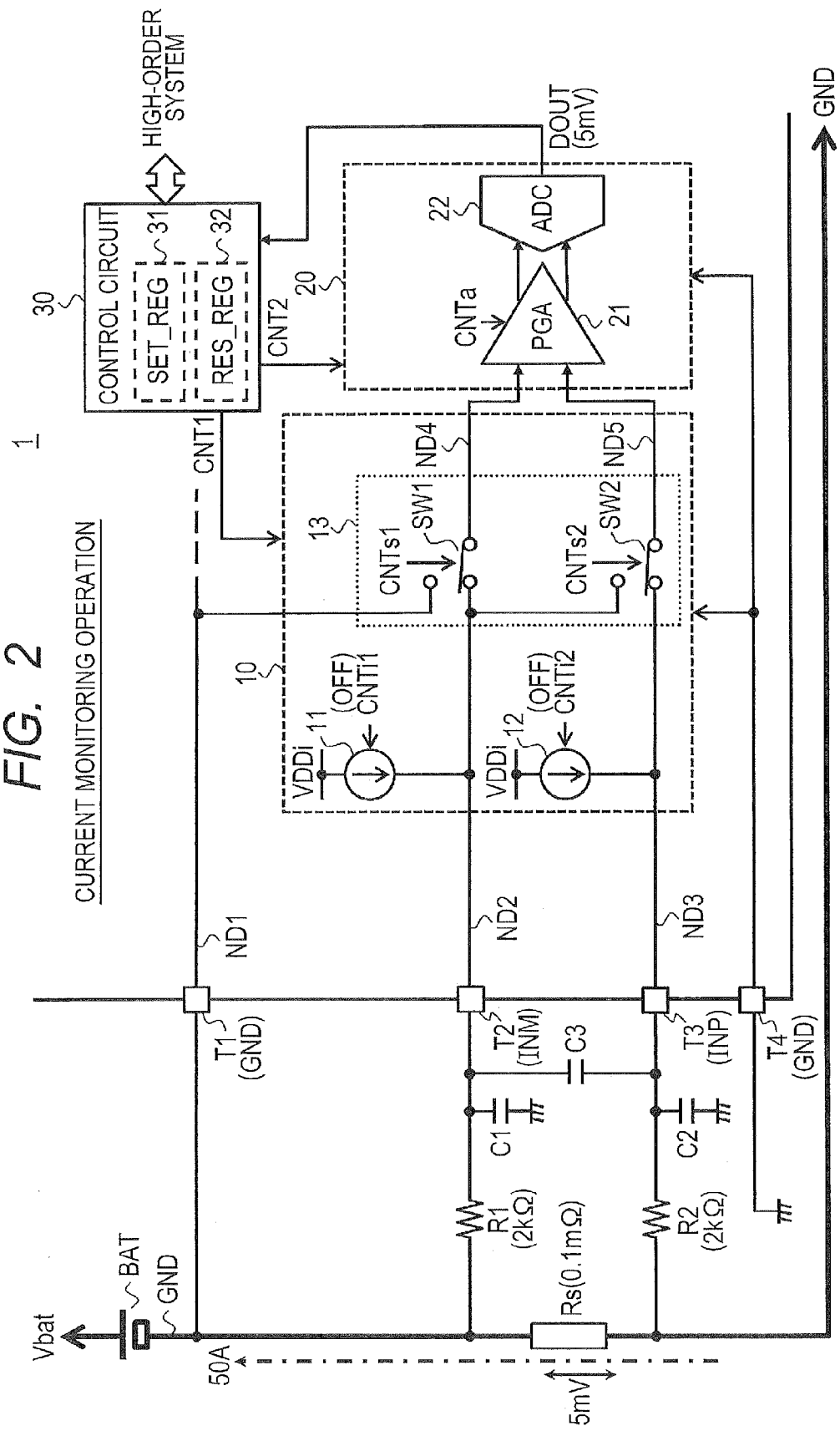
FIG. 2 is a block diagram for explaining a current monitoring operation of the battery state monitoring device according to the first aspect of the present invention.

First, the current monitoring operation will be explained. FIG. 2 shows a block diagram for explaining the current monitoring operation of the semiconductor device 1 according to the first embodiment. As shown in FIG. 2, in the current monitoring operation, the first switching circuit SW1 couples the second internal wiring ND2 and the fourth internal wiring ND4, and the second switching circuit SW2 couples the third internal wiring ND3 and the fifth internal wiring ND5. Moreover, in the current monitoring operation, the first current source 11 and the second current source 12 become in states where outputs of measurement currents are stopped, respectively.

At this time, supposing that the battery BAT is outputting a current of 50 A, a current monitor voltage having a magnitude of 5 mV occurs between the two ends of the shunt resistance. Therefore, a voltage difference of 5 mV occurs between the second external terminal T2 and the third external terminal T3. Then, the voltage difference between the second external terminal T2 and the third external terminal T3 is given to the measurement part 20 through the second internal wiring ND2 to the fifth internal wiring ND5, and the measurement part 20 outputs the voltage difference as the measured value DOUT that indicates a value corresponding to 5 mV.

That is, the semiconductor device 1 acquires the measured value DOUT corresponding to the current monitor voltage value according to the magnitude of a current flowing through the shunt resistance RS in the current monitoring operation. The acquired measured value DOUT is stored in the measured value register 32 of the control circuit 30, and is passed to the high-order system at a request from the high-order system.

Figure 3:
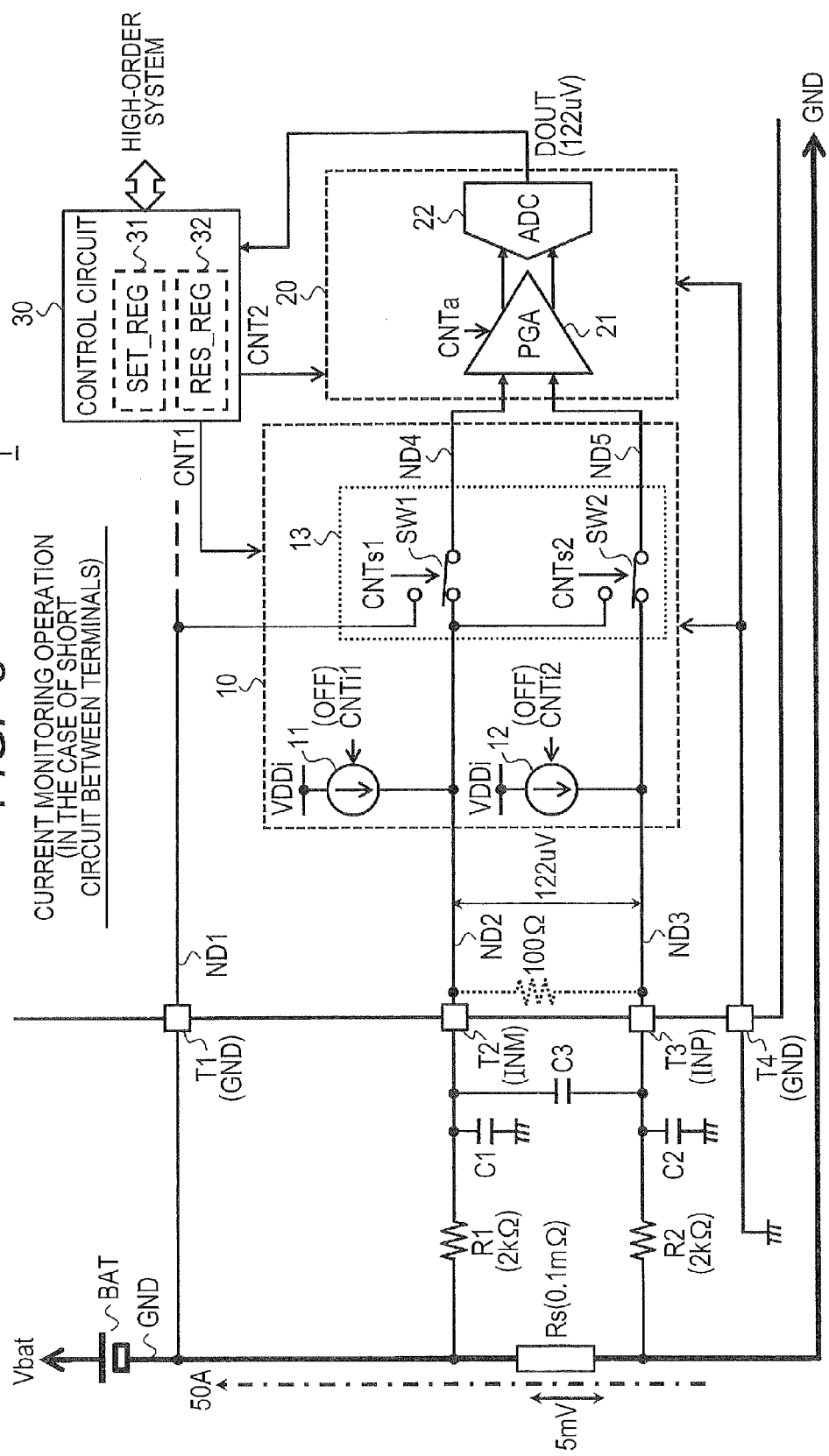
FIG. 3 is a block diagram for explaining the current monitoring operation in case where short circuit between terminals is occurring in the battery state monitoring device according to the first aspect of the present invention.

In the example shown in FIG. 2, the current monitoring operation in the normal state where the short circuit did not occur between the second external terminal T2 and the third external terminal T3 that were coupled through the shunt resistance RS was explained. However, if the short circuit is occurring between the second external terminal T2 and the third external terminal T3, the measurement result will become small and an erroneous measurement will occur. Then, FIG. 3 shows a block diagram of the semiconductor device 1 for explaining the current monitoring operation in case where short circuit between the terminals is occurring in the semiconductor device 1 according to the first embodiment. The example shown in FIG. 3 shows an example where the second external terminal T2 and the third external terminal T3 are short circuited by a resistance component of 100Ω.

As shown in FIG. 3, in case where the short circuit is occurring between the external terminals into which a current monitor voltage is inputted, a combined resistance of the resistances R1, R2 and a resistance component that shorts the two external terminals and the shunt resistance RS are parallel coupled. However, since the resistance value of the shunt resistance is very small compared with the resistances R1, R2, the combined resistance of the shunt resistance RS, the resistances R1, R2, and a shorting resistance component becomes almost equal to the resistance value of the shunt resistance RS. Therefore, the current monitor voltage value occurring between the two ends of the shunt resistance RS hardly varies. However, in the combined resistance of the resistances R1, R2 and the shorting resistance component that are parallel coupled with the shunt resistance RS, the current monitor voltage occurring between the two ends of the shunt resistance is divided into two voltages by a resistance ratio of the resistance components that form the combined resistance. Therefore, the voltage difference between the second external terminal T2 and the third external terminal T3 becomes a value obtained by multiplying a value—that is obtained by dividing the resistance value of the shorting resistance component by a resistance value of the combined resistance of the resistances R1, R2 and the shorting resistance component—by the current monitor voltage. Specifically, the voltage difference between the second external terminal T2 and the third external terminal T3 becomes (100 Ω/4.1 kΩ)×5 mV=122 µV.

Thus, in case where the short circuit occurs between the external terminals coupled by the shunt resistance RS, since a voltage difference different from the current monitor voltage is inputted between the external terminals for monitoring the current monitor voltage, the erroneous measurement occurs. In the semiconductor device 1 according to the first embodiment, the short-circuit test operation detects the short circuit between the external terminals into which the current monitor voltage is inputted. Then, in the following, the short-circuit test operation will be explained.

Figure 4:
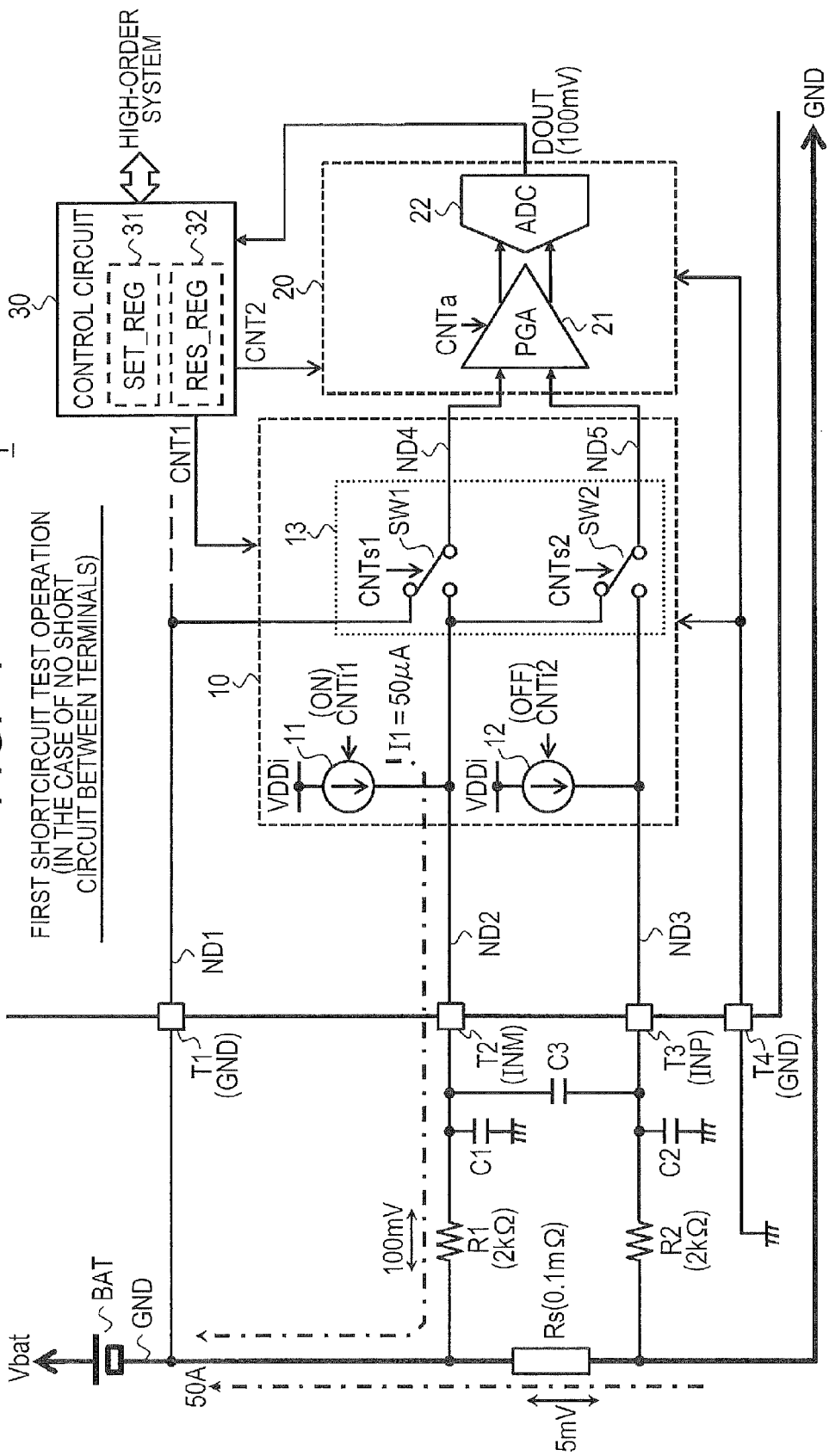
FIG. 4 is a block diagram for explaining an operation of a first short-circuit test operation of the battery state monitoring device according to the first aspect of the present invention in case where the short circuit between the terminals does not occur.
Figure 5:
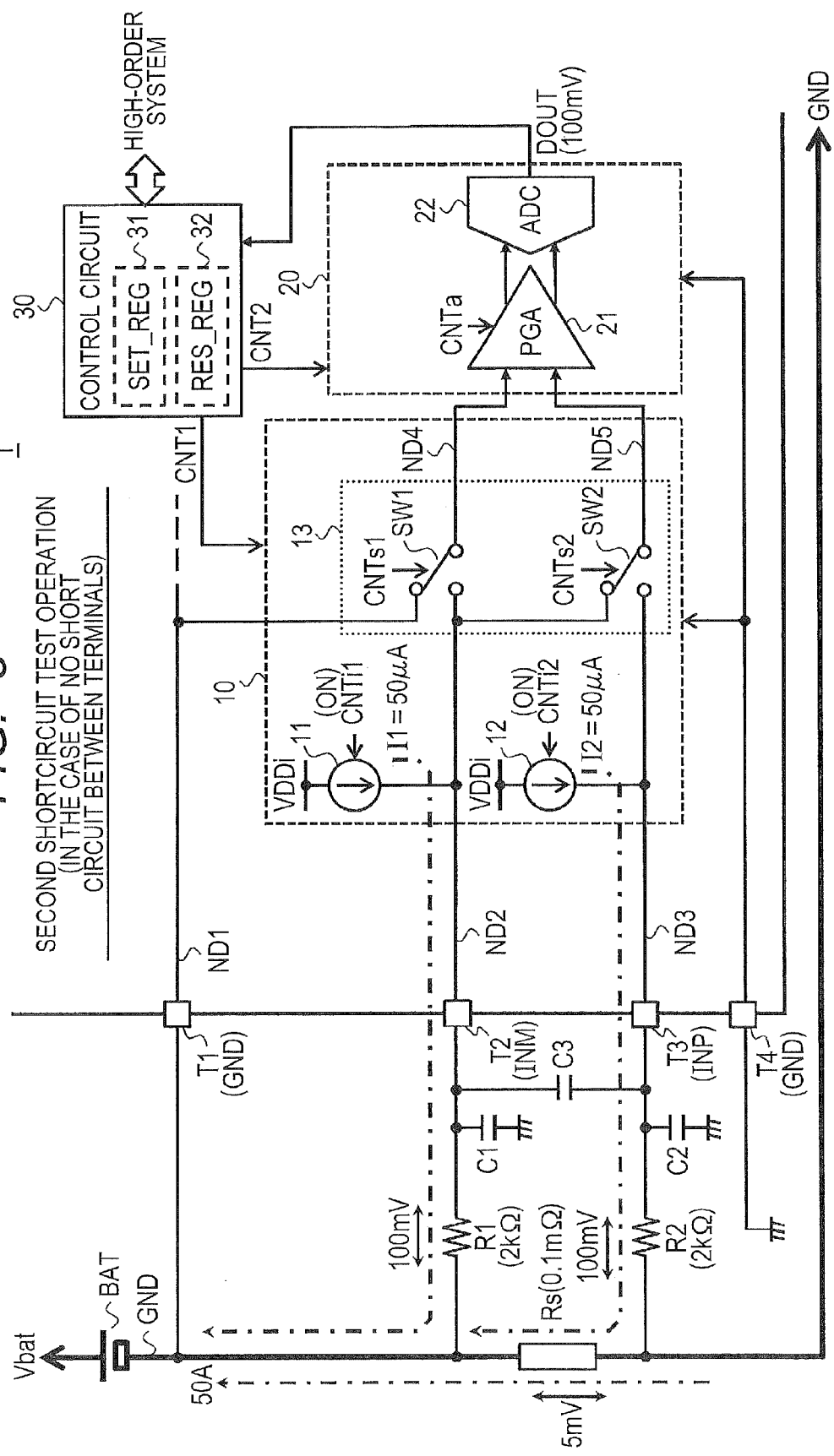
FIG. 5 is a block diagram for explaining an operation of a second short-circuit test operation of the battery state monitoring device according to the first aspect of the present invention in case where the short circuit between the terminals does not occur.

First, FIG. 4 and FIG. 5 show block diagrams of the semiconductor device 1 according to the first embodiment that is for explaining the short-circuit test operation in case where the short circuit does not occur between the second external terminal T2 and the third external terminal T3.

FIG. 4 is a block diagram for explaining an operation of the first short-circuit test operation of the semiconductor device 1 according to the first embodiment. As shown in FIG. 4, in the short-circuit test operation, the semiconductor device makes the first switching circuit SW1 couple the first internal wiring ND1 and the fourth internal wiring ND4. Moreover, the semiconductor device 1 makes the second switching circuit SW2 couple the second internal wiring ND2 and the fifth internal wiring ND5.

Then, the semiconductor device 1 makes the first current source 11 output the first measurement current I1 in the first short-circuit test operation of the short-circuit test operation. In the example shown in FIG. 4, the first measurement current I1 has a magnitude of 50 μA. Moreover, in the first short-circuit test operation, a output of the second measurement current I2 by the second current source 12 become in a state of being stopped.

This first measurement current I1 flows through the resistance R1 through the second internal wiring ND2. Then, the first measurement current I1 flows into the battery BAT. At this time, although the first measurement current I1 is combined with a current flowing through the battery BAT through the shunt resistance RS in the power supply wiring GND, since the first measurement current I1 is very small compared with the current flowing through the shunt resistance RS, it flows into the battery BAT as a current within a margin of error of the current flowing through the shunt resistance.

Then, a voltage difference of 100 mV occurs in the resistance R1 by the first measurement current I1. This voltage difference occurs between the first external terminal T1 and the second external terminal T2, and is inputted into the measurement part 20 through the first switching circuit SW1 and the second switching circuit SW2. Therefore, the measurement part 20 outputs the measured value DOUT corresponding to the voltage difference (100 mV) occurring between two ends of the resistance R1. This measured value DOUT is stored in the measured value register 32 of the control circuit 30.

Next, FIG. 5 shows a block diagram for explaining an operation of the second short-circuit test operation of the semiconductor device 1 according to the first embodiment. Since a voltage input route formed by the route switching circuit 13 is the same as that in the second short-circuit test operation, explanations about the first switching circuit SW1 and the second switching circuit SW2 are omitted here.

In the second short-circuit test operation, both of the first current source 11 and the second current source 12 output measurement currents. At this time, it is desirable in order to facilitate the comparison of the voltage differences measured in the first short-circuit test operation and in the second short-circuit test operation that the first measurement current I1 outputted by the first current source 11 and the second measurement current I2 outputted by the second current source 12 should be in the same magnitude as that of the first measurement current I1 in the case of the first short-circuit test operation. Incidentally, magnitudes of the first measurement current I1 and the second measurement current I2 should just be such that a difference of current quantities differ between in the first short-circuit test operation and in the second short-circuit test operation, and they are not necessarily required to be the same magnitude.

In the second short-circuit test operation, the first measurement current I1 is given to the resistance R1 through the second internal wiring ND2. Moreover, the second measurement current I2 is given to the resistance R2 through the third internal wiring ND3. Thereby, between the two ends of the resistances R1, R2, voltage differences of 100 mV occur, respectively.

Then, also in the second short-circuit test operation, since the voltage difference input route formed by the route switching circuit 13 is the same as that in the first short-circuit test operation, the voltage difference inputted into the measurement part 20 is a voltage difference occurring between the two ends of the resistance R1. At this time, since if the short circuit does not occur between the second external terminal T2 and the third external terminal T3, the magnitudes of the current flowing though the resistance R1 in the first short-circuit test operation and in the second short-circuit test operation will become equal, the voltage differences occurring between the two ends of the resistance R1 in the first short-circuit test operation and in the second short-circuit test operation will become the same value (100 mV). Therefore, also in the second short-circuit test operation, if the short circuit between the terminals does not occur, the measured value DOUT that the measurement part 20 outputs will become the same as that of the first short-circuit test operation. The measured value DOUT that the measurement part 20 outputted in the second short-circuit test operation is stored in the measured value register 32 of the control circuit 30. That is, at the time of completion of the second short-circuit test operation, the measurement result acquired by the first short-circuit test operation and the measurement result acquired by the second short-circuit test operation are stored in the measured value register 32.

Then, the high-order system can acquire the measurement result acquired by the first short-circuit test operation and the measurement result acquired by the second short-circuit test operation from the control circuit 30, and can judge existence of the short circuit between the terminals based on a difference of the two measurement results. Incidentally, in the case of the example shown in FIG. 4 and FIG. 5, since there is no difference between the two measurement results, the high-order system judges that the short circuit between the terminals does not occur.

Figure 6:
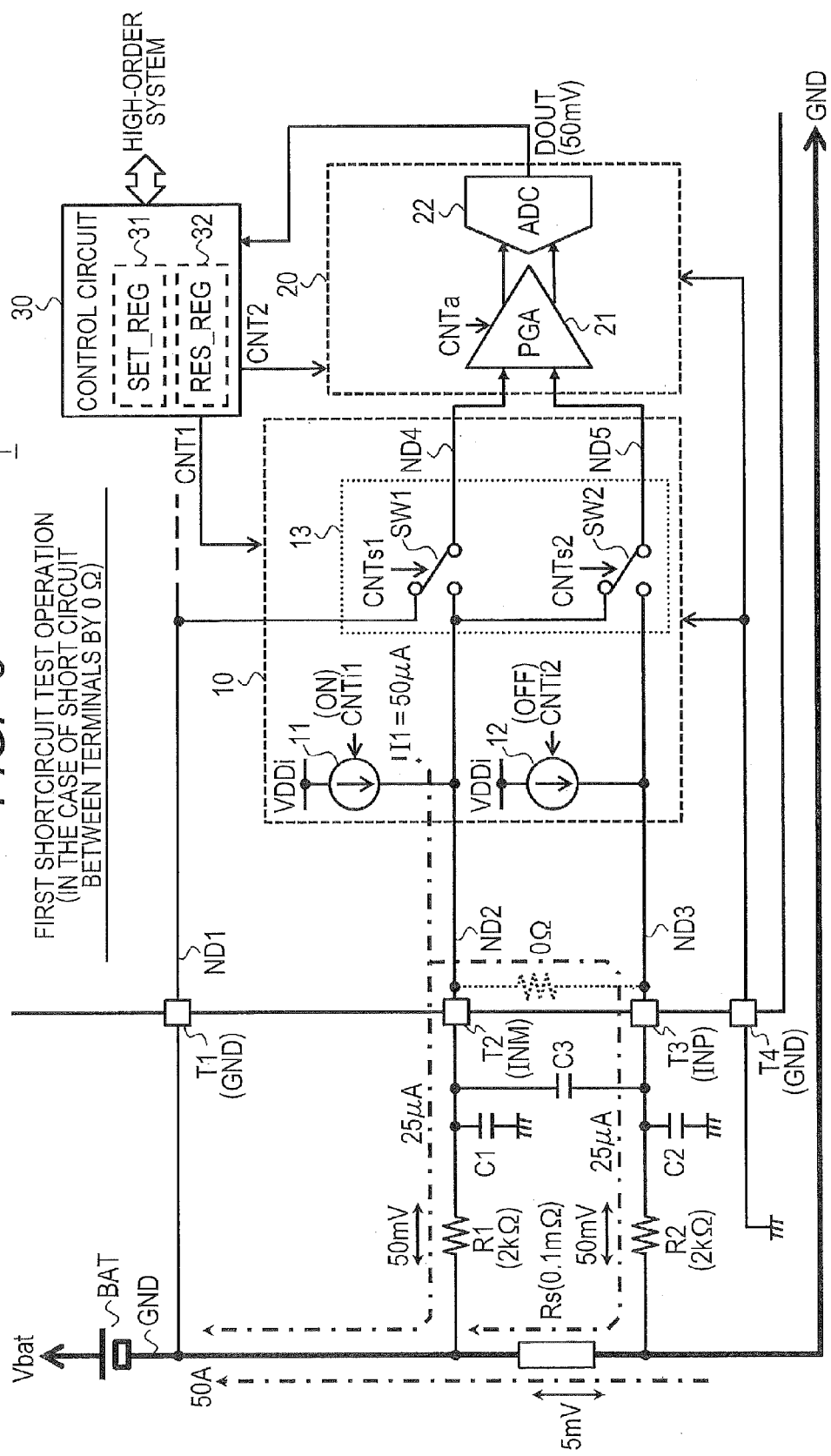
FIG. 6 is a block diagram for explaining an operation of the first short-circuit test operation of the battery state monitoring device according to the first aspect of the present invention in case where the short circuit between the terminals is occurring by 0 Ω.
Figure 7:
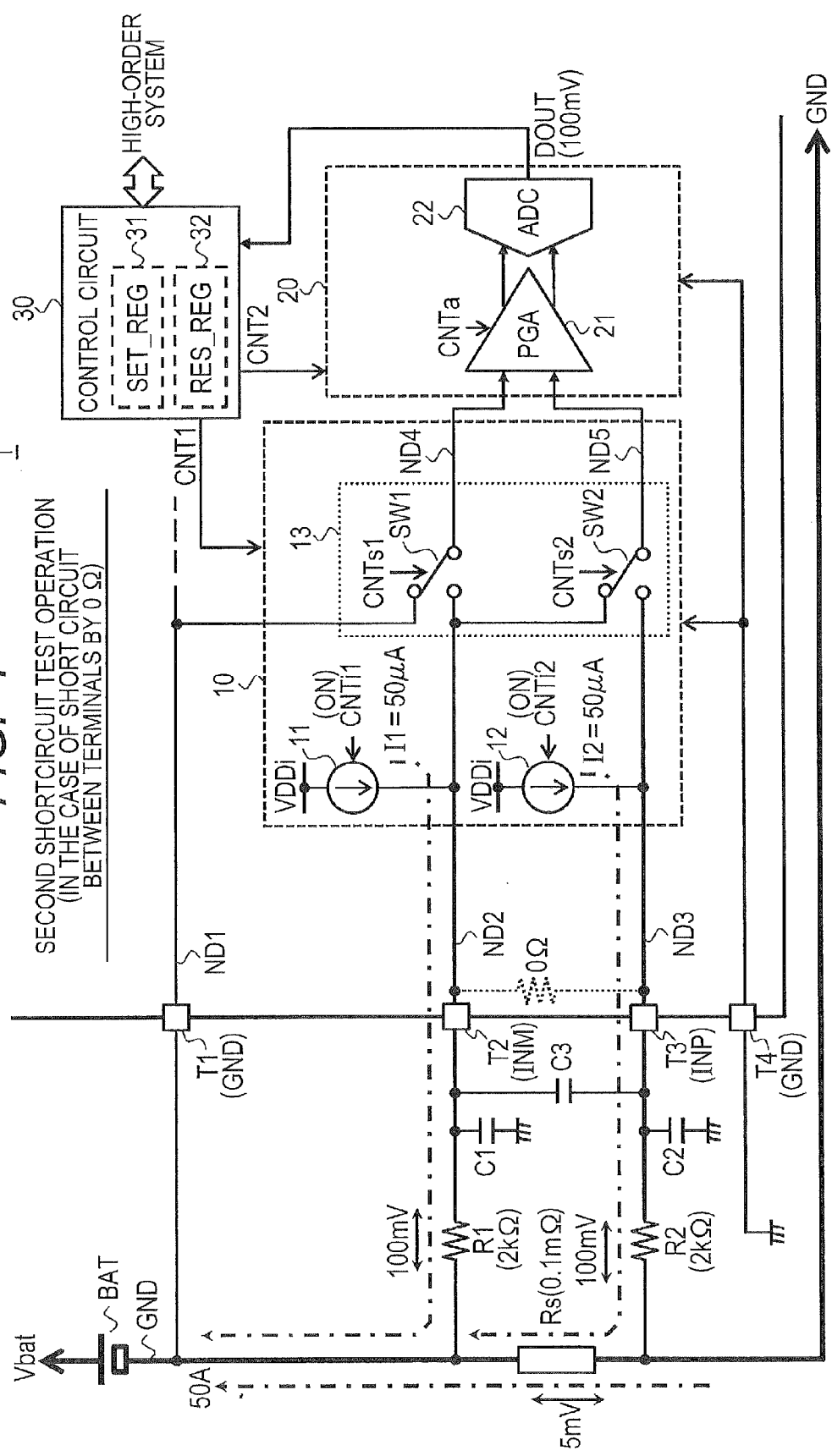
FIG. 7 is a block diagram for explaining an operation of the second short-circuit test operation of the battery state monitoring device according to the first aspect of the present invention in case where the short circuit between the terminals is occurring by 0 Ω.

Next, FIG. 6 and FIG. 7 show block diagrams of the semiconductor device 1 according to the first embodiment that are for explaining the short-circuit test operation in case where the second external terminal T2 and the third external terminal T3 are short circuited by 0Ω. Incidentally, even in case where the short circuit is occurring between the terminals, a coupling relationship of a circuit of the semiconductor device 1 and a circuit block that operates are the same as in the example shown in FIG. 4 and FIG. 5. Therefore, in the semiconductor device 1, explanations about the coupling relationship of the circuit and the circuit block that operates are omitted with respect to explanations about FIG. 6 and FIG. 7.

FIG. 6 is a block diagram for explaining an operation of the first short-circuit test operation of the semiconductor device 1 according to the first embodiment in case where the short circuit between the terminals is occurring by 0Ω. As shown in FIG. 6, in case where the terminals are short circuited, the first measurement current I1 also flows through the resistance R2 through a short-circuited portion. At this time, in case where the terminals are short circuited by 0Ω, an impedance of a current route getting through the resistance R2 and an impedance of a current route getting through the resistance R1 are almost the same. Therefore, the first measurement current I1 flows through the current route getting through the resistance R1 and through the current route getting through the resistance R2 almost equally, respectively. In the example shown in FIG. 6, 25 μA flows through the current route getting through the resistance R1 and the current route getting through the resistance R2, respectively.

Therefore, the voltage occurring between the two ends of the resistance R1 and the voltage occurring between the two ends of the resistance R2 are both about 50 mV. Then, the voltage difference occurring between the two ends of the resistance R1 occurs between the first external terminal T1 and the second external terminal T2, and is inputted into the measurement part 20 through the first switching circuit SW1 and the second switching circuit SW2. Therefore, the measurement part 20 outputs the measured value DOUT corresponding to the voltage difference (50 mV) occurring between the two ends of the resistance R1. This measured value DOUT is stored in the measured value register 32 of the control circuit 30.

Next, FIG. 7 shows a block diagram for explaining an operation of the second short-circuit test operation of the semiconductor device 1 according to the first embodiment in case where the short circuit between the terminals is occurring by 0Ω. As shown in FIG. 7, in the second short-circuit test operation, the first measurement current I1 is given to the resistance R1 through the second internal wiring ND2. Moreover, the second measurement current I2 is given to the resistance R2 through the third internal wiring ND3. At this time, almost no current flows through the short-circuited portion in the example shown in FIG. 7. This is because the voltage of the second external terminal T2 and the voltage of the third external terminal T3 become almost the same since a voltage arising in the current route getting through the resistance R1 and a voltage arising in the current route getting through the resistance R2 are almost the same by the first measurement current I1 and the second measurement current I2. Thereby, voltage differences of 100 mV occur between respective two ends of the resistances R1, R2, respectively.

Then, also in the second short-circuit test operation, since the voltage difference input route formed by the route switching circuit 13 is the same as in the first short-circuit test operation, the voltage difference inputted into the measurement part 20 is the voltage difference occurring between the two ends of the resistance R1. That is, in the example shown in FIG. 7, the measured value DOUT that the measurement part 20 outputs in the second short-circuit test operation becomes 100 mV. Then, the measured value that the measurement part 20 outputted in the second short-circuit test operation is stored in the measured value register 32 of the control circuit 30. That is, at the time of completion of the second short-circuit test operation, the measurement result acquired by the first short-circuit test operation and the measurement result acquired by the second short-circuit test operation are stored in the measured value register 32.

Then, the high-order system can acquire the measurement result acquired by the first short-circuit test operation and the measurement result acquired by the second short-circuit test operation from the control circuit 30, and can judge existence of the short circuit between the terminals based on a difference of the two measurement results. Incidentally, in the case of the example shown in FIG. 6 and FIG. 7, since there is a difference of 50 mV in the two measurement results, the high-order system judges that the short circuit between the terminals is occurring. That is, the use of the semiconductor device 1 according to the first embodiment can make a difference occur in the voltage difference produced in the resistance R1 due to the existence/absence of the short circuit between the terminals and makes it possible to recognize the short circuit between the terminals based on the difference in the voltages occurring in the resistance R1 between in the first short-circuit test operation and in the second short-circuit test operation. That is, magnitudes of the first measurement current I1 and the second measurement current I2 are required just to be able to generate the voltage difference occurring in the above-mentioned resistance R1, and are not necessarily required to have the same magnitude.

Figure 8:
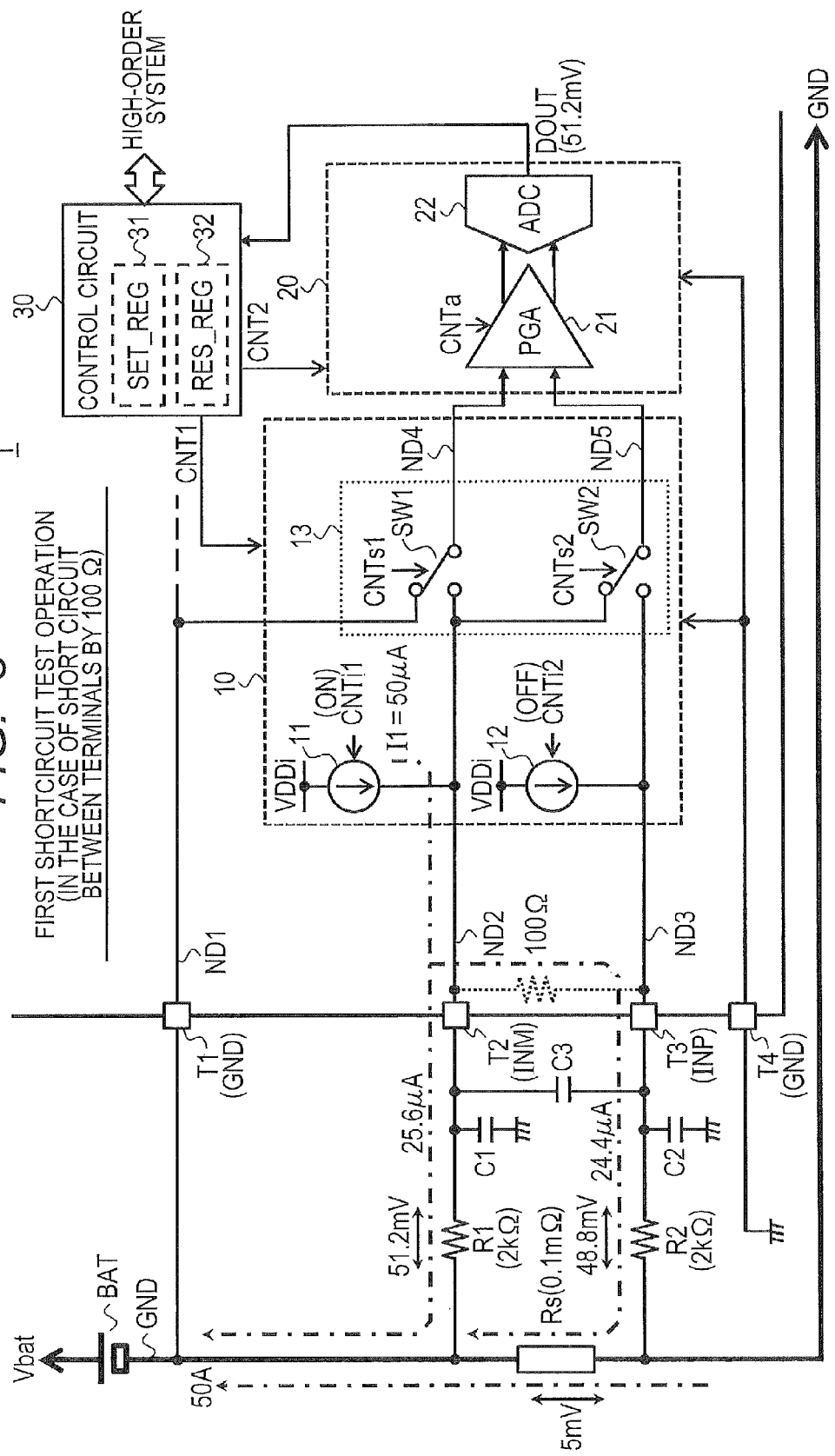
FIG. 8 is a block diagram for explaining an operation of the first short-circuit test operation of the battery state monitoring device according to the first aspect of the present invention in case where the short circuit between the terminals is occurring by 100 Ω.
Figure 9:
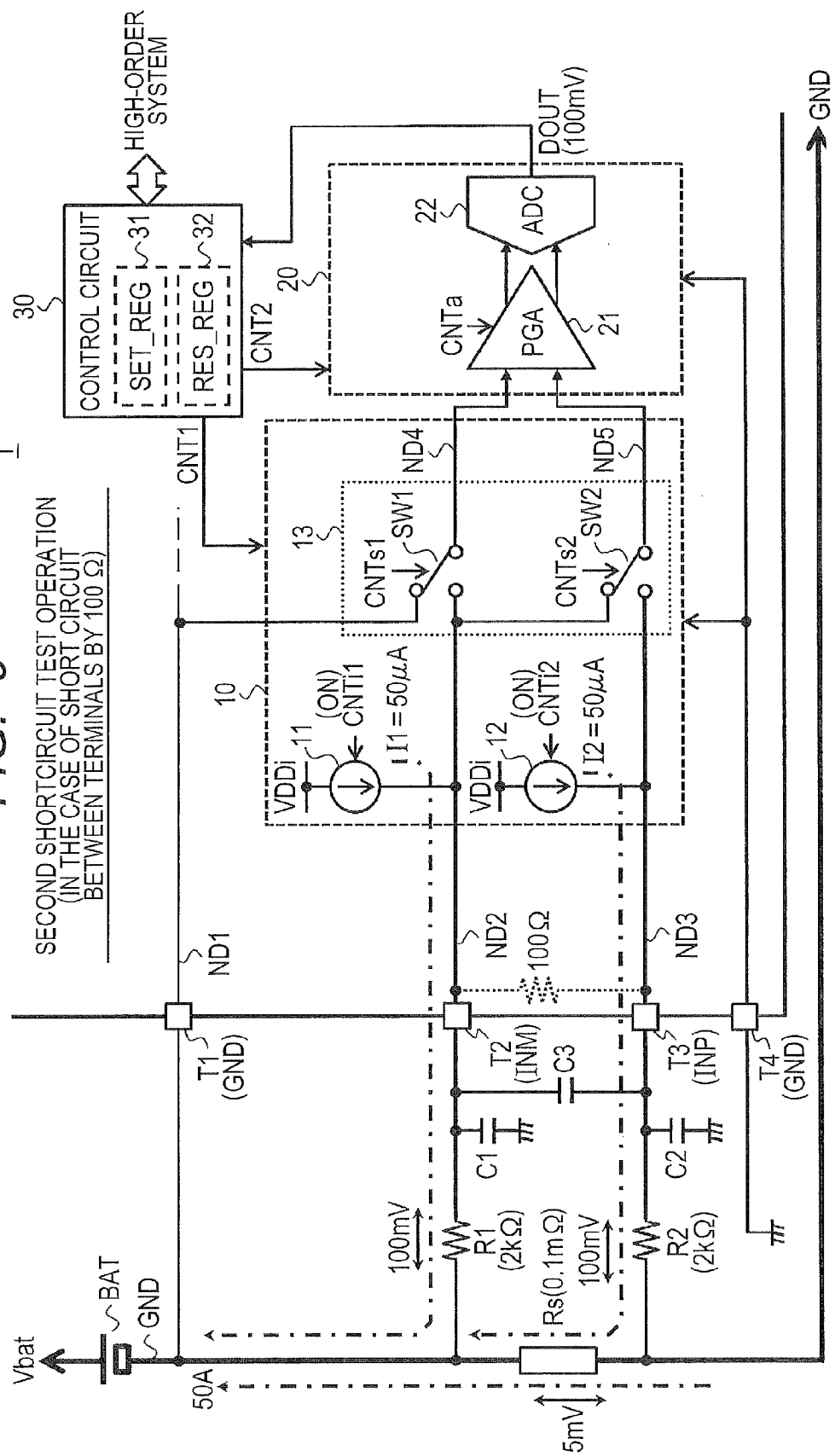
FIG. 9 is a block diagram for explaining an operation of the second short-circuit test operation of the battery state monitoring device according to the first aspect of the present invention in case where the short circuit between the terminals is occurring by 100 Ω.

Next, FIG. 8 and FIG. 9 show block diagrams of the semiconductor device 1 according to the first embodiment that is for explaining the short-circuit test operation in case where the second external terminal T2 and the third external terminal T3 are short circuited by 100Ω. Incidentally, also in the case where the terminals are short circuited by a resistance component of 100Ω, the coupling relationship of the circuit of the semiconductor device 1 and the circuit block that operates are the same as in the example shown in FIG. 4 and FIG. 5. Therefore, in the semiconductor device 1, explanations about the coupling relationship of the circuit and the circuit block that operates are omitted with respect to explanations about FIG. 8 and FIG. 9.

FIG. 8 is a block diagram for explaining an operation of the first short-circuit test operation of the semiconductor device 1 according to the first embodiment in case where the short circuit between the terminals is occurring by 100Ω. As shown in FIG. 8, in case where the terminals are in short circuit, the first measurement current I1 flows also through the resistance R2 through the short-circuited portion. At this time, in case where the terminals are short circuited by 100Ω, an impedance of the current route getting through the resistance R1 is about 2 kΩ, and an impedance of the current route getting through the resistance R2 is about 2.1 kΩ. Therefore, the first measurement current I1 is divided into two routes according to an impedance ratio thereof: a current of 25.6 µA flows through the current route getting through the resistance R1, and a current of 24.4 µA flows through the current route getting through the resistance R2.

Therefore, the voltage difference occurring between the two ends of the resistance R1 becomes about 51.2 mV, and a voltage difference occurring between the two ends of the resistance R2 becomes about 48.8 mV. Then, the voltage difference occurring between the two ends of the resistance R1 occurs between the first external terminal T1 and the second external terminal T2, and is inputted into the measurement part 20 through the first switching circuit SW1 and the second switching circuit SW2. Therefore, the measurement part 20 outputs an output DOUT that has the measured value DOUT corresponding to the voltage difference (51.2 mV) occurring between the two ends of the resistance R1. This measured value DOUT is stored in the measured value register 32 of the control circuit 30.

Next, FIG. 9 shows a block diagram for explaining an operation of the second short-circuit test operation of the semiconductor device 1 according to the first embodiment in case where the short circuit between the terminals is occurring by 100Ω. As shown in FIG. 9, in the second short-circuit test operation, the first measurement current I1 is given to the resistance R1 through the second internal wiring ND2. Moreover, the second measurement current I2 is given to the resistance R2 through the third internal wiring ND3. At this time, a current hardly flows through the short-circuited portion in the example shown in FIG. 9. This is because the voltage of the second external terminal T2 and the voltage of the third external terminal become almost the same since the voltage arising in the current route getting through the resistance R1 and the voltage arising in the current route getting through the resistance R2 by the first measurement current I1 and the second measurement current I2, respectively, are almost the same. Thereby, voltage differences of 100 mV occur between respective two ends of the resistances R1, R2, respectively.

Then, since the voltage difference input route formed by the route switching circuit 13 is the same as that of the first short-circuit test operation also in the second short-circuit test operation, the voltage difference inputted into the measurement part 20 is the voltage difference occurring between the two ends of the resistance R1. That is, in the example shown in FIG. 9, the measured value DOUT that the measurement part 20 outputs in the second short-circuit test operation becomes 100 mV. Then, the measured value DOUT that the measurement part 20 outputted in the second short-circuit test operation is stored in the measured value register 32 of the control circuit 30. That is, at the time of completion of the second short-circuit test operation, the measurement result acquired by the first short-circuit test operation and the measurement result acquired by the second short-circuit test operation are stored in the measured value register 32.

Then, the high-order system can acquire the measurement result acquired by the first short-circuit test operation and the measurement result acquired by the second short-circuit test operation from the control circuit 30, and can judge existence/absence of the short circuit between the terminals based on a difference of the two measurement results.

Incidentally, in the case of the example shown in FIG. 8 and FIG. 9, the high-order system determines that the short circuit between the terminals is occurring because there is a difference of 48.8 mV between the two measurement results.

From the above-mentioned explanation, the semiconductor device 1 according to the first embodiment performs the short-circuit test operation that detects the short circuit between the two external terminals (e.g., the second external terminal T2 and the third external terminal T3) coupled through the shunt resistance RS. In this short-circuit test operation, the semiconductor device 1 performs an operation related to the first short-circuit test operation and an operation related to the second short-circuit test operation.

Moreover, the semiconductor device 1 is coupled with a peripheral circuit that has the resistance R1 coupled between the second external terminal T2 and the one end of the shunt resistance RS and the resistance R2 coupled between the third external terminal T3 and the other end of the shunt resistance RS.

Then, the semiconductor device 1 has second internal wiring ND2 coupled to the resistance R1 through the second external terminal T2 and third internal wiring ND3 coupled to the resistance R2 through the third external terminal T3. Moreover, the semiconductor device 1 has the first external terminal T1 that is coupled to the shunt resistance RS and is not susceptible to the voltage variation by the resistances R1, R2.

Then, in the first short-circuit test operation, the semiconductor device 1 outputs the first measurement current I1 to the second internal wiring ND2, and also stops the output of the second measurement current I2 destined to the third internal wiring ND3. Moreover, in the first short-circuit test operation, the semiconductor device 1 outputs the first measurement current I1 to the second internal wiring ND2, and also outputs the second measurement current I2 to the third internal wiring ND3. At this time, in the both operating states of the first short-circuit test operation and the second short-circuit test operation, the semiconductor device 1 acquires the voltage difference occurring between the two ends of the resistance R1 through the first external terminal T1 and the second external terminal T2.

Thereby, in case where there occurs the short circuit between the second external terminal T2 and the third external terminal T3, the semiconductor device 1 can detect voltage differences that are different in the first short-circuit test operation and in the second short-circuit test operation.

When detecting the short circuit between the terminals for monitoring the voltage difference occurring between two ends of a resistance having a small resistance value as is close to the wiring resistance, like the shunt resistance RS, the shorting resistance component that is occurred by the short circuit has a very small influence on the current monitor voltage occurring between the two ends of the shunt resistance RS. Therefore, the short circuit between the terminals cannot be detected only with the current monitor voltage that occurs in the shunt resistance RS. On the other hand, in case where the short circuit is occurring between the terminals, there is a problem that the voltage difference between the external terminals lowers and the erroneous measurement of the current monitor voltage occurs resulting from the peripheral circuit coupled between the external terminal into which the current monitor voltage of the shunt resistance RS is inputted and the shunt resistance RS.

However, according to the semiconductor device 1 according to the first embodiment, it is possible to detect the short circuit between the terminals that are coupled with the resistance having the small resistance value, like the shunt resistance RS by the short-circuit test operation.

Moreover, the semiconductor device 1 according to the first embodiment is capable of detecting the short circuit between the terminals as described above only by having two current sources and two switching circuits. That is, since there are very few circuits required for the short-circuit test operation, even if an inter-terminal short circuit detection function is added to the semiconductor device 1, an increase of its circuit scale can be suppressed.

Figure 10:
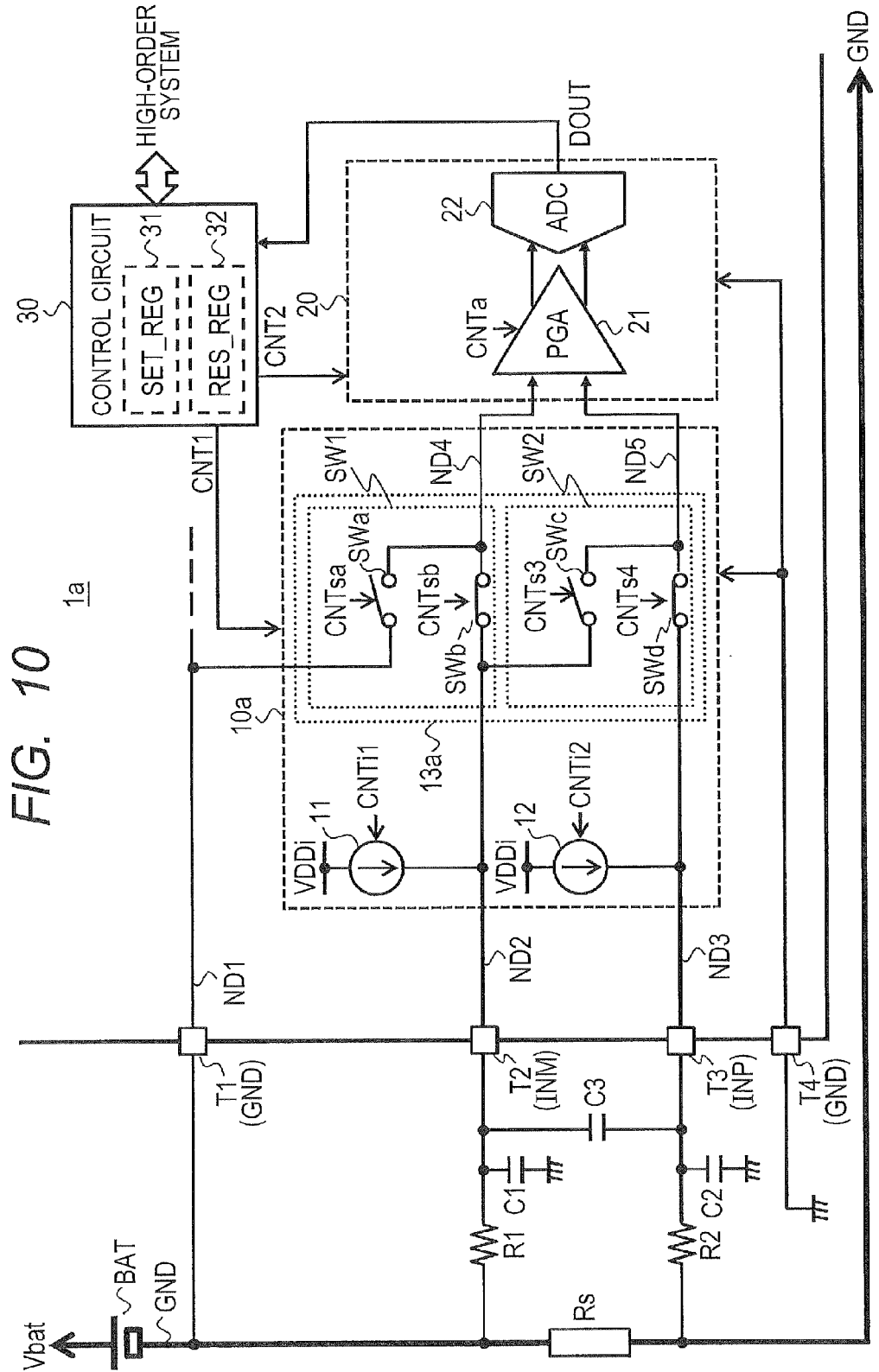
FIG. 10 is a block diagram showing a first modification of the battery state monitoring device according to the first aspect of the present invention.

Incidentally, various modifications are conceivable about a circuit configuration of the semiconductor device 1. Then, FIG. 10 shows a block diagram of a semiconductor device 1a that is a first modification of the semiconductor device 1. The semiconductor device 1a shown in FIG. 10 shows the modification of the first switching circuit SW1 and the second switching circuit SW2 of the semiconductor device 1. A battery state monitoring state 1a forms the first switching circuit SW1 with two switching circuits of switching circuits SWa, SWb. Moreover, the battery state monitoring state 1a forms the second switching circuit SW2 with two switching circuits of switching circuits SWc, SWd. Then, the battery state monitoring state 1a controls exclusively a group of the switching circuits SWa, SWc and a group of the switching circuits SWb, SWd exclusively by CNTsa to CNTsd included in the control signal CNT1. Thereby, the battery state monitoring state 1a can perform the same operation as that of the semiconductor device 1. Incidentally, in FIG. 10, a reference symbol of 10a is given to the input control circuit that has the first switching circuit SW1 and the second switching circuit SW2 each of which is comprised of two switching circuits, respectively, and a reference symbol of 13a is given to the route switching circuit.

Figure 11:
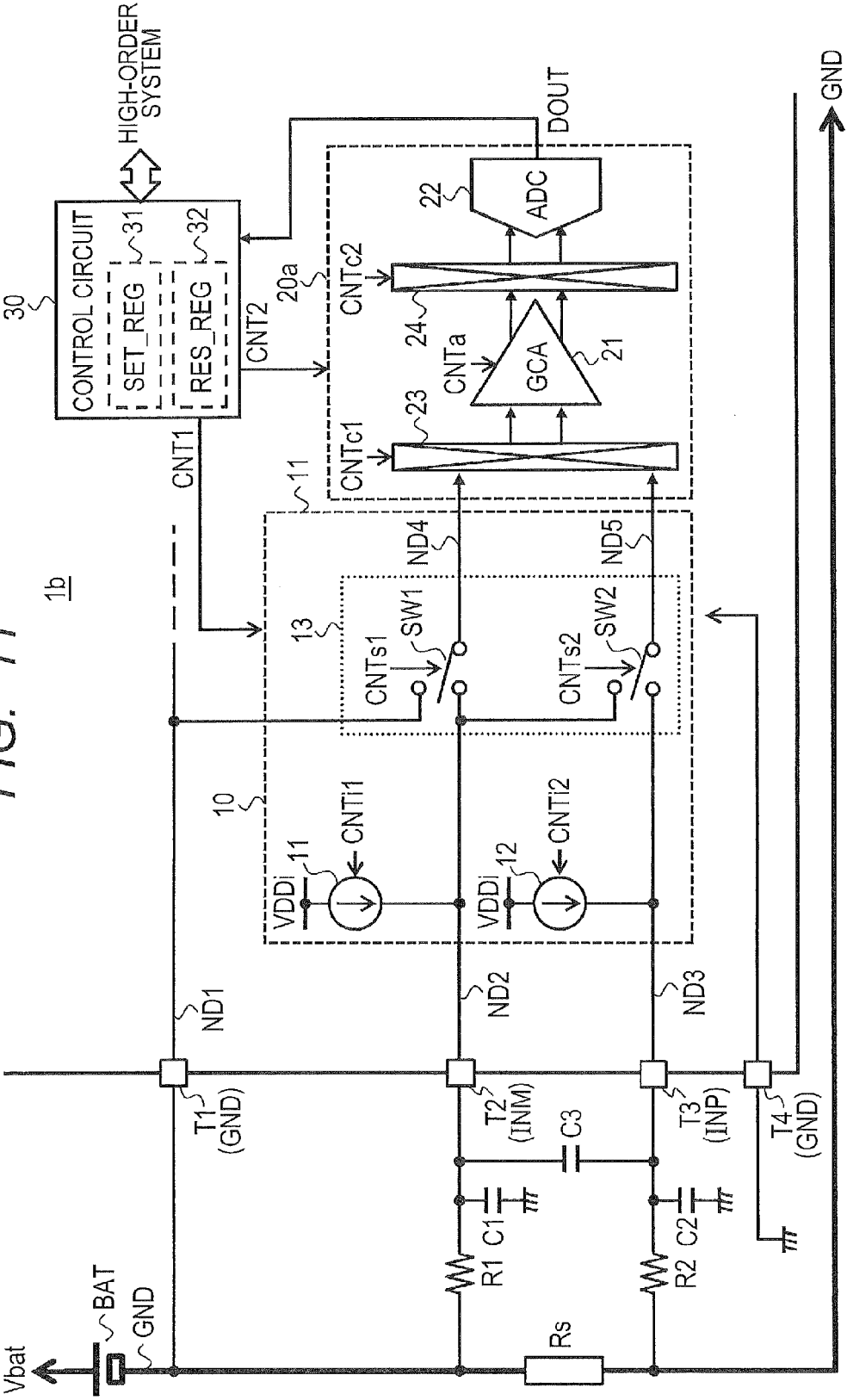
FIG. 11 is a block diagram showing a second modification of the battery state monitoring device according to the first aspect of the present invention.

Next, FIG. 11 shows a block diagram of a semiconductor device 1b that is a second modification of the semiconductor device 1 according to the first embodiment. As shown in FIG. 11, a battery state monitoring state 1b has a measurement part 20a that is a modification example of the measurement part 20. The measurement part 20 is a variable gain amplifier with chopping circuits 23, 24 provided to an input side route and an output side route thereof, respectively. Each of the chopping circuits 23, 24 is one that switches routes of two inputs and two outputs of the variable gain amplifier 21. The chopping circuits 23, 24 are controlled by chopping control signals CNTc1, CNTc2 included in the control signal CNT2.

By providing these chopping circuits 23, 24, for example, even when a magnitude relationship of the voltages that occur between the two ends of the shunt resistance RS is reversed, the voltage difference of the same polarity can be outputted to the analog-digital converter 22. The battery BAT is a lead battery and a direction through which a current flows is different between in the case of charging and in the case of discharging. Therefore, the use of these chopping circuits enables the analog-digital converter 22 to output the measured value DOUT that shows an absolute value of the current monitor voltage.

Second Embodiment

Figure 12:
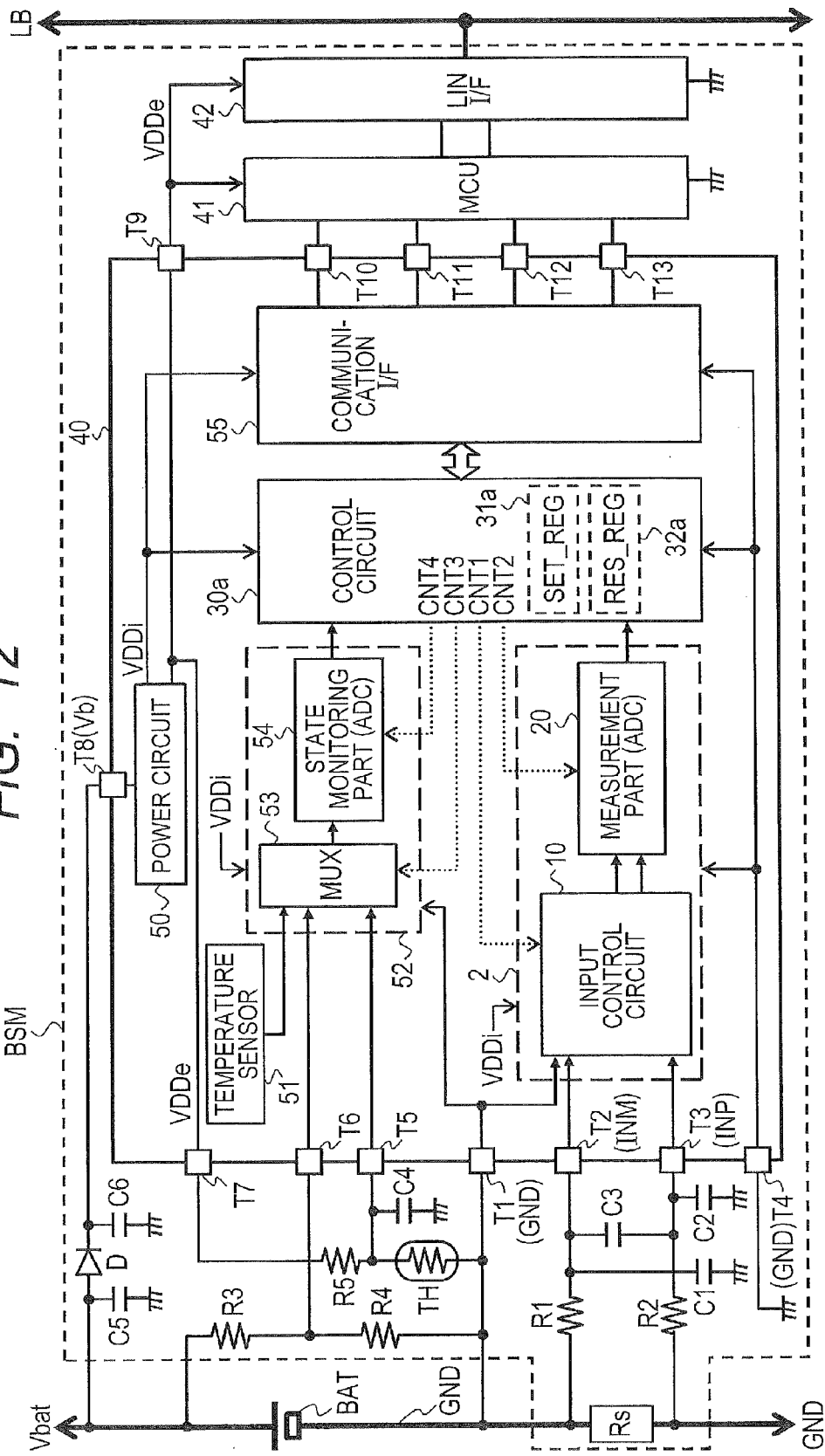
FIG. 12 is a block diagram of a battery state monitoring module according to a second embodiment.

In a second embodiment, a battery state monitoring module that includes the semiconductor device 1 explained in the first embodiment will be explained. FIG. 12 shows a block diagram of a battery state monitoring module BSM. As shown in FIG. 12, the battery state monitoring module BSM has a battery state monitoring device 40, an arithmetic circuit 41, and a LIN (Local Interconnect Network) interface 42. Moreover, the battery state monitoring module BSM has the current detecting resistance (e.g., the shunt resistance RS), resistances R1 to R5, a thermistor TH, capacitors C5 to C6, and a diode D as elements of the peripheral circuit used for measuring a voltage and a current of a measuring object.

The battery state monitoring device 40 according to the second embodiment has a current monitor voltage measurement circuit 2 and a control circuit 30a as circuits equivalent to the semiconductor device 1 according to the first embodiment. The control circuit 30a is a control circuit including a function of the control circuit 30 according to the first embodiment shown in FIG. 1. Moreover, the current monitor voltage measurement circuit 2 has the input control circuit 10 and the measurement part 20 of the semiconductor device 1 according to the first embodiment shown in FIG. 1. Incidentally, in an explanation of the battery state monitoring module BSM according to the second embodiment, parts already explained in the explanation of the semiconductor device 1 according to the first embodiment are given the same reference symbols as those of the first embodiment, and their explanations are omitted.

Moreover, the battery state monitoring device 40 has a power supply circuit 50, a temperature sensor 51, a monitor circuit (e.g., a battery state measuring part 52), and a communication interface 55, in addition to the current monitor voltage measurement circuit 2. The power supply circuit 50 generates an internal voltage VDDi and a module power supply voltage VDDe from a power supply voltage Vb that is stepped down from the battery voltage Vbat by a step-down circuit comprised of the capacitors C5, C6 and the diode D. The internal voltage VDDi is used as an operating voltage of a circuit built in the battery state monitoring module BSM. The module power supply voltage VDDe is used as an operating voltage of the arithmetic circuit 41, the LIN interface 42, and the thermistor TH provided in the battery state monitoring module BSM.

In the battery state monitoring module BSM according to the second embodiment, the thermistor TH is provided outside the battery state monitoring device 40, and it measures directly a temperature of the battery BAT with the thermistor TH. The thermistor TH is an element whose resistance value varies according to temperature. The battery state monitoring module BSM generates a battery environmental temperature value (e.g., a temperature sensing voltage) by dividing a voltage difference of the ground voltage GND and the module power supply voltage VDDe with the thermistor TH and the resistance R5. This battery environmental temperature value is a value corresponding to the environmental temperature of the battery BAT.

The temperature sensor 51 outputs a substrate environmental temperature value (e.g., a substrate temperature voltage) corresponding to the temperature of the semiconductor substrate in which the battery state monitoring device 40 is formed. By installing the battery state monitoring module BSM in the vicinity of the battery BAT, the temperature of the semiconductor substrate of the battery state monitoring device 40 of the battery state monitoring module BSM can be made to be one that generally reflects the environmental temperature of the battery BAT. Therefore, the substrate temperature voltage generated by the temperature sensor 51 without using the thermistor TH can also be made to be the battery environmental temperature value. Since it is not necessary to provide a temperature sensor separately by adopting a form like this, it is possible to realize reduction in failure rate and reduction in cost by curtailment of the number of parts.

The battery state measuring part 52 outputs at least a battery voltage value that varies according to the voltage of the battery and the battery environmental temperature value corresponding to the temperature of the battery as measured values. More specifically, the battery state measuring part 52 performs taking-in of information about the temperature and a voltage of the measuring object and digitization of the taken-in information. The battery state measuring part 52 has a selector 53 and a state monitor part 54.

The selector 53 selects any one of the battery voltage Vbat, the module power voltage VDDe, and the temperature sensing voltage in response to a control signal CNT3 outputted from the control circuit 30a, and gives it to the state monitor part 54. The state monitor part 54 is a circuit block that has, for example, a variable gain amplifier and an analog-digital converter. A gain is set up in the variable gain amplifier according to a control signal CNT4 outputted from the control circuit 30a. Then, the state monitor part 54 outputs the measured value corresponding to the voltage value outputted from the selector 53. The measured value outputted by the state monitor part 54 is stored in a measured value register 32a of the control circuit 30a.

The control circuit 30a has an operating state setting register 31a, and makes measured value decision circuits, such as a sequencer, operate according to the setup value of the operating state setting register 31a. Then, the control circuit 30a outputs the control signal CNT3 for specifying the voltage of the measuring object decided by the measured value decision circuit and the control signal CNT4 for specifying a gain corresponding to the voltage of the measuring object.

Incidentally, in the example shown in FIG. 12, the battery voltage Vbat, the battery environmental temperature value, and the substrate temperature voltage are designated as measuring objects. At this time, a voltage obtained by dividing the battery voltage Vbat with the resistances R3, R4 coupled in series between the anode terminal and the cathode terminal of the battery BAT is inputted into the battery state measuring part 52 as the battery voltage Vbat. Thus, by dividing the battery voltage Vbat of the measuring object, it is possible to measure the battery voltage Vbat whose magnitude is more than or equal to the module power supply voltage VDDe accurately within an operating range of the battery state measuring part 52 that uses the module power supply voltage VDDe as its operating voltage. Moreover, although the resistance R5 and the thermistor TH were coupled in series, this can generate the battery environmental temperature value that reflects a variation of the resistance value of the thermistor TH.

The communication interface 55 performs a communication processing between the control circuit 30a and the arithmetic circuit 41 according to a communication protocol specified in the arithmetic circuit 41.

The arithmetic circuit 41 determines the state of the battery BAT based on the measurement results including the current monitor voltage value measured by the battery state monitoring device 40, and transmits the determination result at a request from the high-order system. More specifically, the arithmetic circuit 41 determines the state of the battery BAT based on the current monitor voltage value, the battery voltage value, and the battery environmental temperature value. Details of a method for determining the state of the battery BAT in the arithmetic circuit 41 will be described later.

The LIN interface 42 performs a communication between the high-order system and the arithmetic circuit 41 according to a LIN protocol. CAN (Controller Area Network) has been used much in in-vehicle networks heretofore. The CAN protocol is a protocol that is settled in order to perform a power train control and a chassis control, and can realize a high transmission speed and high reliability. However, in subnetwork communications of a sensor, an actuator, etc., neither the transmission speed nor the reliability is needed as much as the power train control and the chassis control. The LIN protocol is settled as a protocol that can configure a command transmission/reception for the sensor control and the actuator control like this using a network with a system cheaper than the CAN protocol.

Following this, the current monitoring operation by the battery state monitoring module BSM according to the second embodiment will be explained. The battery state monitoring module BSM performs a life judgment of the battery. This judgment is made based on the value that the arithmetic circuit 41 acquired in the battery state monitoring device 40. Then, characteristics of the battery BAT will be explained first. Incidentally, in the following explanation, an example where a battery for automobile that contains lead in its electrode material is used as the battery BAT will be explained.

Figure 13:
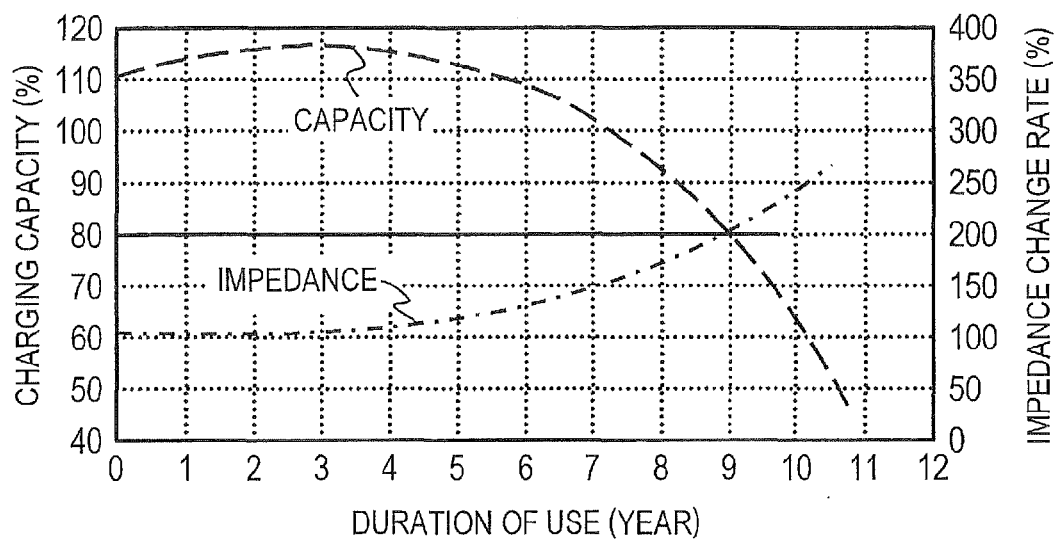
FIG. 13 is a graph for explaining a secular change of characteristics of a battery.

FIG. 13 shows a graph for explaining a secular change of the characteristics of the battery BAT. The graph shown in FIG. 13 shows a capacity of the battery BAT and a secular change of its impedance. As shown in FIG. 13, in the battery BAT, its capacitance value falls from a value at the time of initiating the use as its duration of use becomes long. Moreover, in the battery BAT, its output impedance becomes gradually large as the duration of use becomes long. At this time, a period up to a time when the output impedance and the capacitance value cross is specified as a life of the battery BAT.

Figure 14:
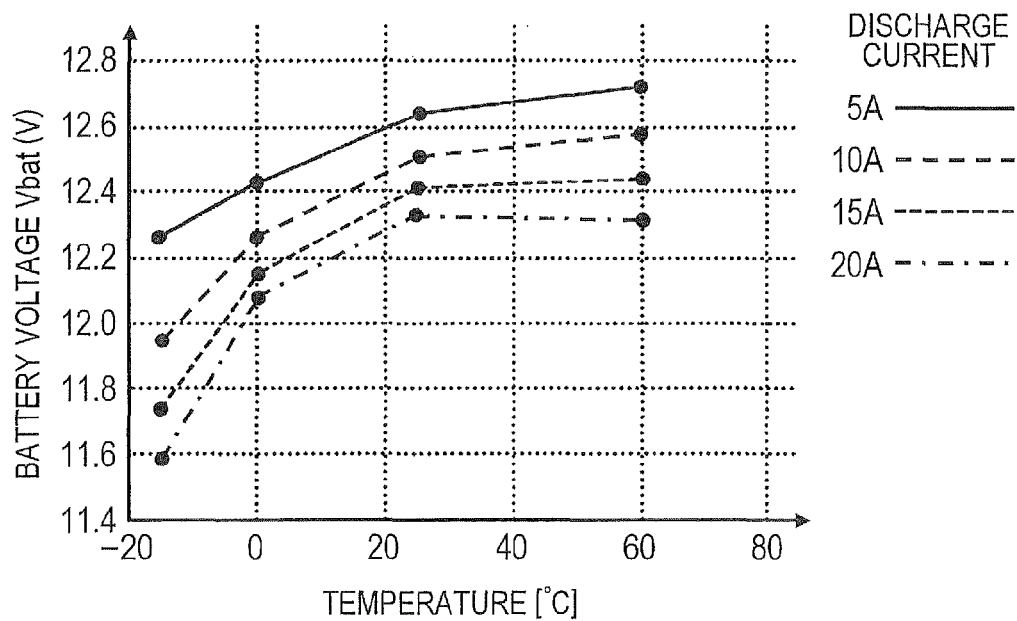
FIG. 14 is a graph for explaining a current output characteristic of the battery.

Moreover, FIG. 14 shows a graph for explaining a current output characteristic of the battery BAT. As shown in FIG. 14, in the battery BAT, the lower the temperature, the larger the fall of the battery voltage Vbat at the time of current output becomes. Moreover, in the battery BAT, the larger the output current, the larger the voltage fall of the battery voltage Vbat becomes.

FIG. 13 and FIG. 14 shows that, in calculating the life of the battery BAT, it is necessary to take into consideration information about the temperature in addition to the output current and the battery voltage Vbat at the time point.

Figure 15:
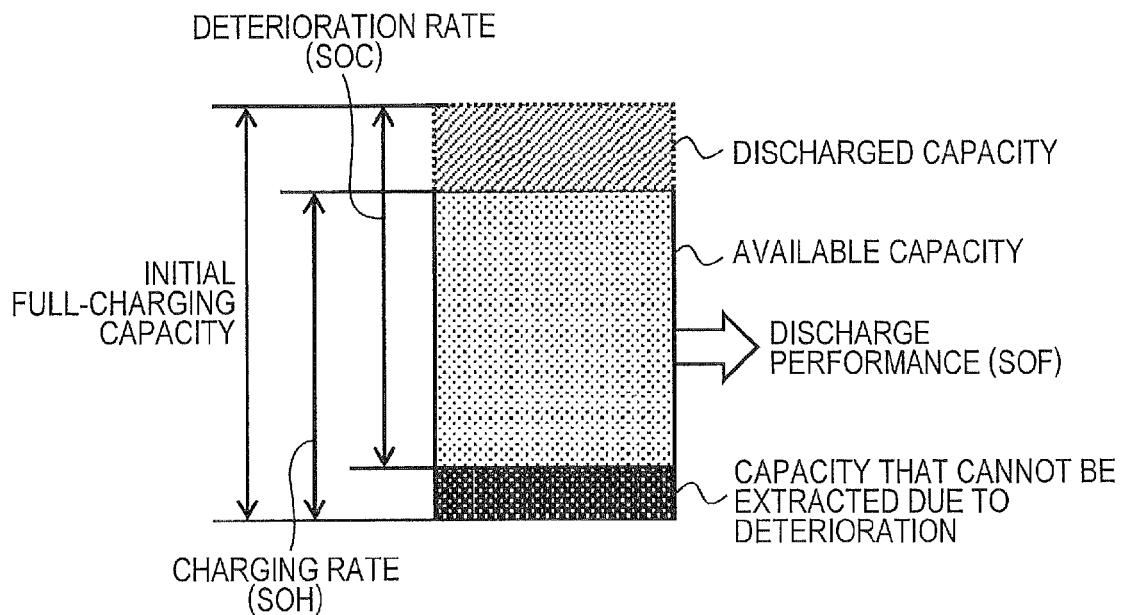
FIG. 15 is a diagram for explaining performance indices of the battery.

Following this, a calculation method of the life of the battery BAT will be explained. FIG. 15 shows a diagram for explaining performance indices of the battery. As shown in FIG. 15, as indices showing a storage capacity, there are an initial full-charging capacity, a charging rate, a deterioration rate, and a capacity that cannot be extracted due to deterioration in the battery BAT. Then, the performance indices of the battery BAT are calculable from these values.

Note here that in the battery BAT, the electrodes deteriorate by deterioration and the storage capacity decreases. This decreased capacity is the capacity that cannot be taken out due to deterioration. The initial full-charging capacity is a value that indicates the amount of electric charges that can be charged in the initial state of the battery. The charging rate is a value that indicates the amount of electric charge at the present time to the initial full-charging capacity. The deterioration rate is a value that indicates a ratio of the usable amount of electric charges to the initial full-charging capacity. Incidentally, the charging rate (SOC: State of Charge) and the deterioration rate (SOH: State of Health) are calculated by the following Formula 1 and Formula 2.

$$SOC = \text{Remaining capacity } (Ah)/\text{initial full-charging capacity } (Ah) \times 100 \quad (1)$$

$$SOH = \text{full-charging capacity at the time of deterioration}/\text{initial full-charging capacity } (Ah) \times 100 \quad (2)$$

Figure 16:
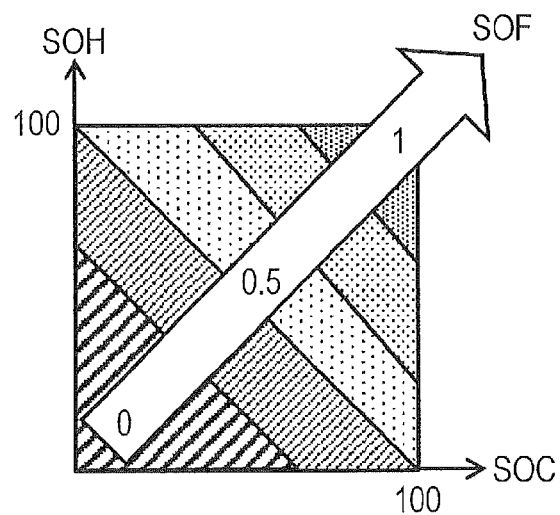
FIG. 16 is a diagram for explaining a relationship between a charging rate, a deterioration rate, and discharge performance of the battery.

The amount of electric charges of the battery BAT can be calculated by monitoring the amount of electricity charging and discharging of the battery BAT. The battery state monitoring module BSM according to the second embodiment monitors the amount of electricity charging and discharging of the battery BAT using the current monitor voltage measurement circuit 2 and calculates the above-mentioned charging rate and deterioration rate based on the monitored result. Moreover, the discharge performance is an index calculated from the charging rate and the deterioration rate. Then, FIG. 16 shows a graph showing a relationship among the charging rate, the deterioration rate, and the discharge performance (SOF: State of Function). As shown in FIG. 16, the discharge performance shows better values as a point goes to the upper right of the graph. More specifically, the discharge performance has a characteristic that it becomes higher when the deterioration rate is low (its value is large) and the charging rate is high (its value is large). Moreover, the discharge performance has a characteristic that it becomes smaller when the deterioration rate is higher (the value is smaller) or the charging rate is lower (the value is smaller).

Moreover, the arithmetic circuit 41 performs performance judgment of the battery taking into consideration the battery voltage Vbat and the battery environmental temperature at the time of performing a determination processing of battery performance. For example, if the battery environmental temperature at the time of the determination processing is low, the arithmetic circuit 41 performs a processing, such as setting a threshold of the battery voltage Vbat at which the battery state is judged excellent with respect to the calculated discharge performance to a little bit higher value.

As is clear from the above-mentioned explanation, it is possible for the battery state monitoring module BSM according to the second embodiment to calculate the discharge performance of the battery BAT accurately by monitoring the current value with the current monitor voltage measurement circuit 2. Moreover, since the current monitor voltage measurement circuit 2 can detect the short circuit between the terminals like the semiconductor device 1 according to the first embodiment, it is possible to improve the reliability of the measurement result by performing this short-circuit test operation.

Third Embodiment

In a third embodiment, a vehicle system including a battery state monitoring device according to the second embodiment (e.g., the battery state monitoring module BSM) will be explained. The vehicle system according to the third embodiment has an idling stop function whereby the engine is stopped in a period when the vehicle is stopped and the engine is restarted at the time of vehicle restart. Since this idling stop function will need to restart the engine with a starter whenever the vehicle moves to a run state from a stop state, life management of the battery is very important.

Figure 17:
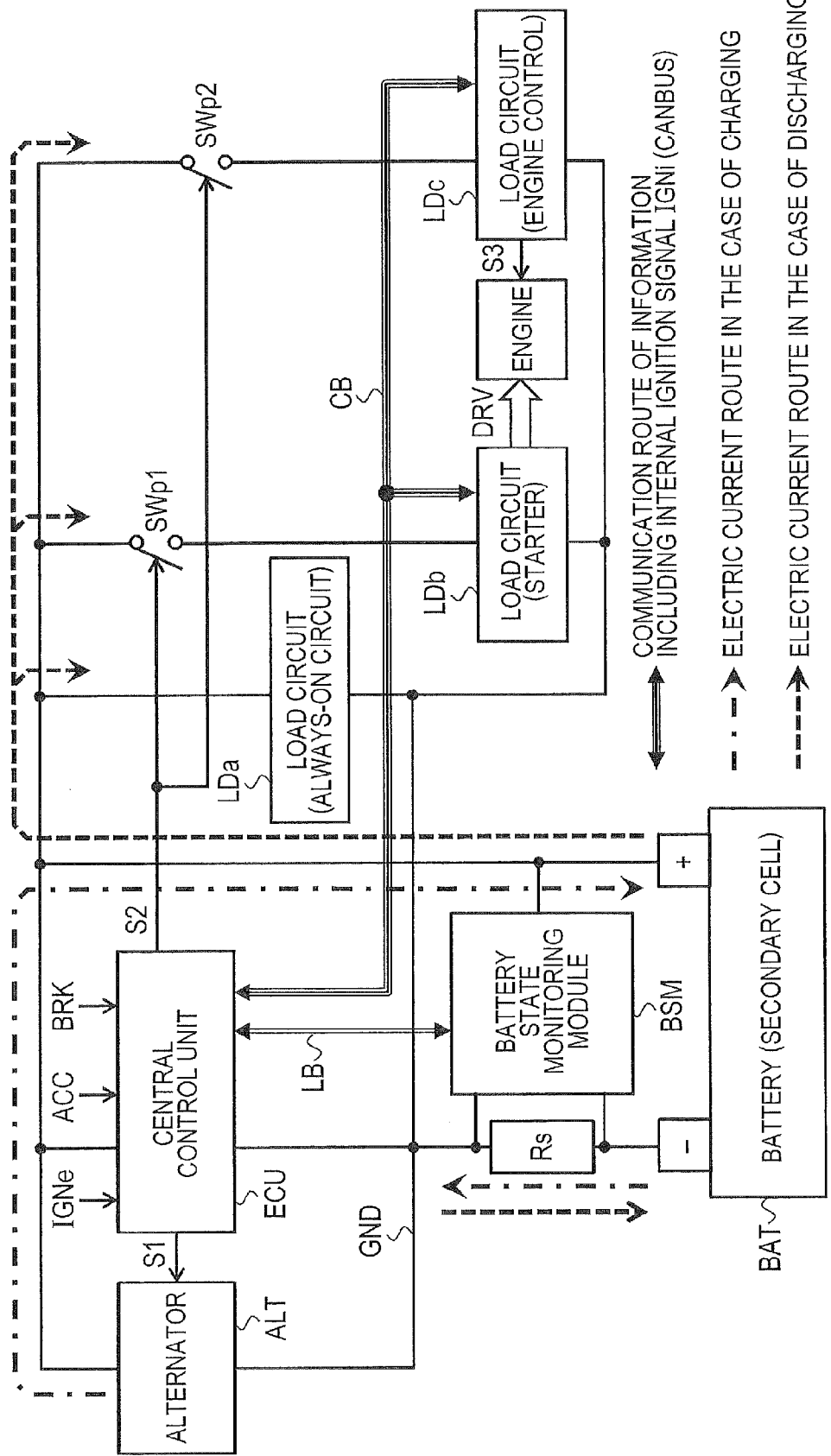
FIG. 17 is a block diagram of a vehicle system according to a third embodiment.

FIG. 17 shows a block diagram of a vehicle system according to the third embodiment. As shown in FIG. 17, the vehicle system according to the third embodiment has a battery BAT, an alternator ALT, a central control unit ECU, load circuits LDa to LDc, an engine, and switching circuits SWp1, SWp2 in addition to the battery state monitoring module BSM according to the second embodiment.

Incidentally, the load circuit LDa is an electronic circuit that always operate an air-conditioner etc. The load circuit LDb includes the starter and a circuit for controlling the starter. The load circuit LDc is a circuit for controlling the engine. Moreover, the switching circuits SWp1, SWp2 switch supply and interception of electric power to the load circuit LDb and the load circuit LDc. An open and a closed states of these switching circuits SWp1, SWp2 are controlled by a switch control signal S2 outputted from the central control unit ECU. Moreover, the central control unit ECU switches the alternator ALT between a power generation state and a power generation stop state by a control signal S1. For example, the central control unit ECU stops power generation by the alternator in order to reduce an engine load at the time of engine start.

In the vehicle system, power generation is performed by the engine making the alternator ALT operate. The electric power generated by the alternator ALT is charged to the battery BAT. Moreover, in the vehicle system, the electric power is supplied to various load circuits using the battery BAT.

The central control unit ECU controls the engine based on vehicle control values directed by an external ignition signal IGNe, an accelerator signal ACC, and a brake signal BRK. More specifically, the external ignition signal IGNe is a signal that is enabled when a user gives the vehicle a start direction using a key. The accelerator signal ACC is a signal that has a value reflecting the user's accelerator operation. The brake signal BRK is a signal that has a value according to the amount of depression of a brake pedal by the user. The central control unit ECU controls the starter and the engine according to these signals.

Moreover, the central control unit ECU outputs an internal ignition signal that directs start and stop of the engine to an electronic load circuit for controlling the engine and the starter. The central control unit ECU sets the internal ignition signal IGNi to be in an enabled state
in response to the external ignition signal IGNe becoming an enable signal. The internal ignition signal IGNi is given to the load circuit LDb through a CAN bus CB. Thereby, the starter starts starting. Moreover, the internal ignition signal IGNi is also given to the load circuit. LDa through the CAN bus CB. The load circuit LDc performs a control of the amount of fuel supplied to the engine, a control of opening and closing of a throttle, etc. according to the internal ignition signal IGNi.

Moreover, the central control unit ECU is coupled with the battery state monitoring module BSM through a LIN bus LB. In response to the vehicle moving to the stop state, the central control unit ECU makes the engine move to a stop state by the internal ignition signal IGNi, and also directs the battery state monitoring module BSM to perform a diagnosis processing of the battery by the short-circuit test operation and by the current monitoring operation. Moreover, in the case of making the vehicle move from the stop state to the run state, the central control unit ECU makes the starter and the engine start by the internal ignition signal IGNi, and receives a result of the diagnosis processing of the battery.

Moreover, in case where the received result of the diagnosis processing indicates that a capability of the battery BAT is insufficient for engine restart, the central control unit ECU maintains the engine in the operating state regardless of the vehicle state for a period until the external ignition signal inputted from the outside moves to the stop state. That is, in case where the capability of the battery BAT is insufficient for the engine restart, the idling stop function is invalidated.

Figure 18:
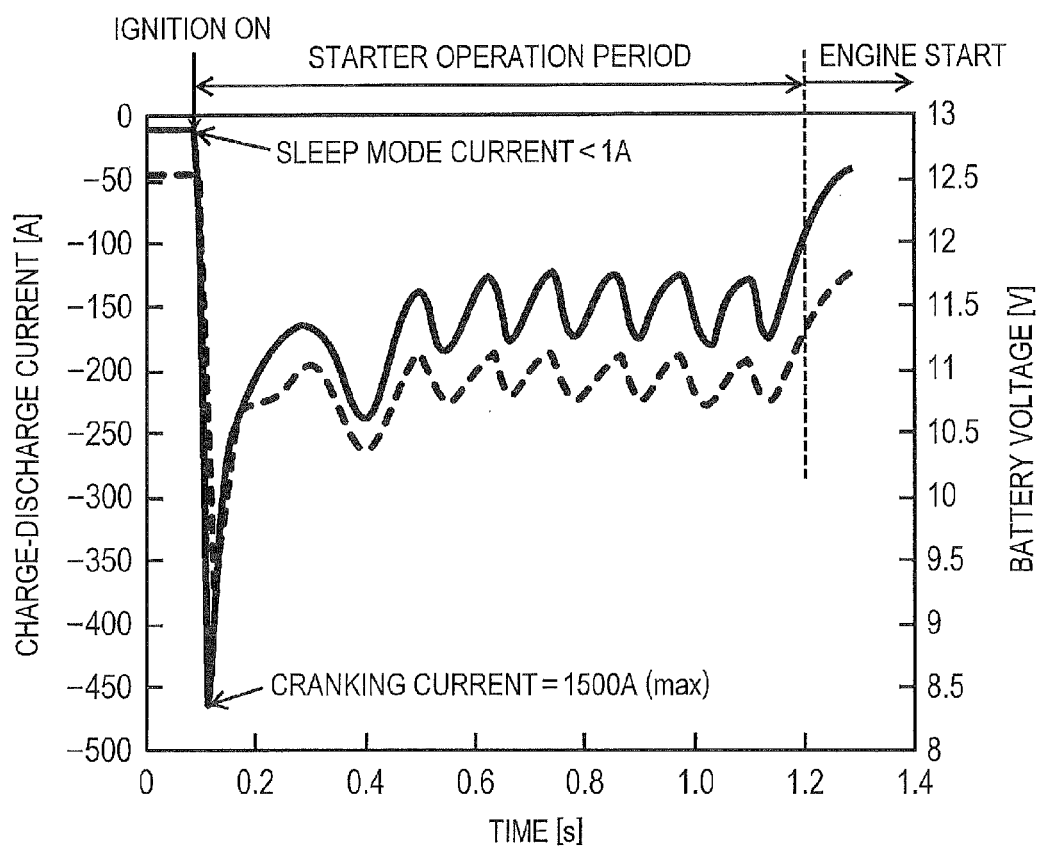
FIG. 18 is a graph for explaining variations of a current and a voltage of the battery at the time of engine start.

Here, an operation of the vehicle system according to the third embodiment will be explained. First, FIG. 18 shows a graph for explaining variations of the current and voltage of the battery at the time of the engine start in the vehicle system. As shown in FIG. 18, in the vehicle system, the starter is operated in response to the ignition signal (e.g., the internal ignition signal IGNi) becoming in an ON state (e.g., the enabled state). The starter consumes a current whose amount reaches to a magnitude of 1500 A at the maximum at the time of start. Therefore, the battery voltage Vbat falls largely when the starter is started. Then, when the engine has started, the central control unit ECU stops the starter and operates the engine. Thereby, an output current from the battery BAT becomes small, and the battery voltage Vbat is recovered.

Figure 19:
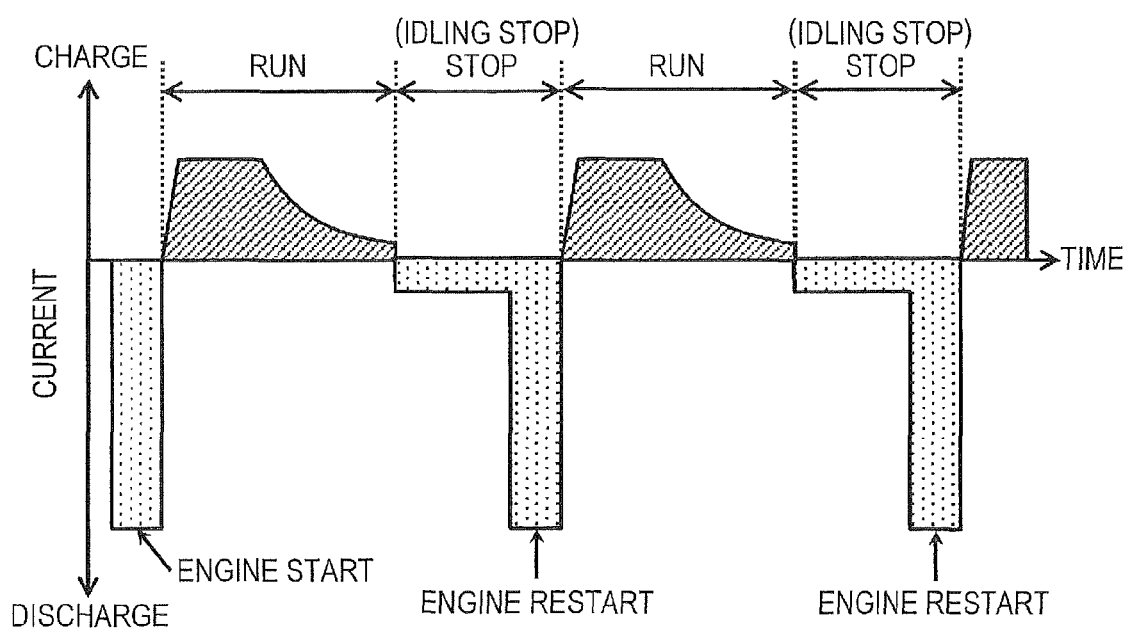
FIG. 19 is a timing chart for explaining a charge/discharge operation of the vehicle system according to the third embodiment.

Moreover, FIG. 19 shows a timing chart for explaining a charge/discharge operation in the vehicle system according to the third embodiment. As shown in FIG. 19, in the vehicle system according to the third embodiment, since the engine stops by the idling stop function at the time of the stop, the power generation by the alternator stops. Therefore, in the vehicle system according to the third embodiment, electronic devices of the vehicle system are operated by electric discharge from the battery BAT in the stop state. Moreover, in the vehicle system according to the third embodiment, much current is consumed by the starter at the time of the engine start.

Moreover, in the vehicle system according to the third embodiment, since the alternator can be operated by the engine at the run time, charging by the alternator is performed.

Figure 20:
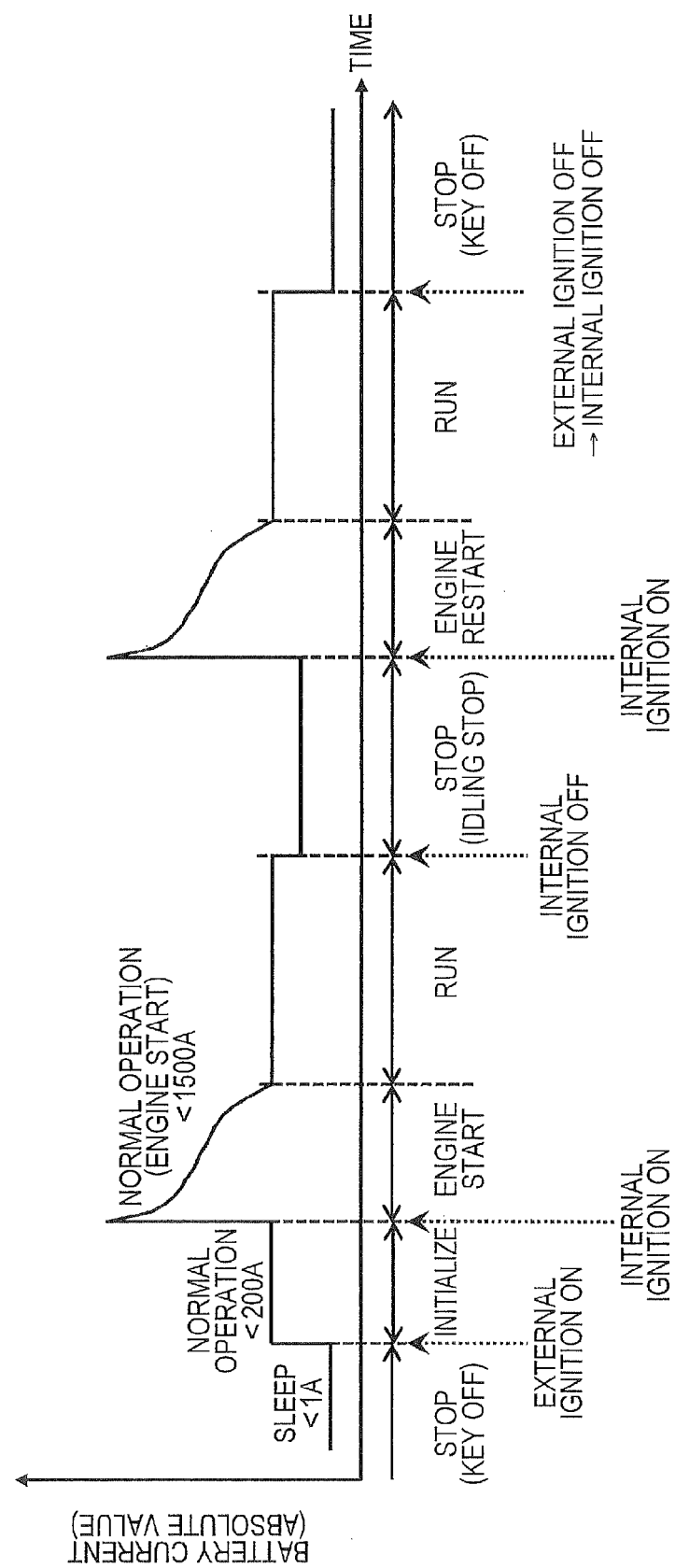
FIG. 20 is a timing chart for explaining an operation of the vehicle system according to the third embodiment.

Next, FIG. 20 shows a timing chart for explaining an operation of the vehicle system according to the third embodiment. As shown in FIG. 20, in the vehicle system according to the third embodiment, the external ignition signal IGNe is made to be in the enabled state in response to KEY ON to the vehicle system, and the central control unit ECU performs a system initialization processing of the whole system in response to the external ignition signal IGNe. Then, in response to the initialization processing completing, the central control unit ECU sets the internal ignition signal IGNi to be in the enabled state. Thereby, the vehicle system makes the starter operate to start the engine.

Following this, the vehicle system moves to the run state of using the engine. Then, in response to the vehicle moving to the stop state, the central control unit ECU makes the engine be in the stop state by setting the internal ignition signal IGNi to be in a disenabled state. Then, in case where the vehicle moves to the run state, the central control unit ECU makes the engine start by making the starter operate by setting the internal ignition signal IGNi to be in the enabled state.

Furthermore, in response to the vehicle becoming in the stop state and to the external ignition signal IGNe becoming in the disenabled state, the vehicle system stops the engine by setting the internal ignition signal IGNi to be in the disenabled state, and also makes the vehicle system be in a sleep state.

In performing the operation shown in FIG. 20, the vehicle system according to the third embodiment receives a diagnostic result of the battery from the battery state monitoring module BSM by the central control unit ECU before making the engine be in the stop state, and determines whether the engine stop by the idling stop function is performed at the time of the next stop. This prevents a restart failure of the engine caused by expiration of the life of the battery BAT in the vehicle system according to the third embodiment.

Figure 21:
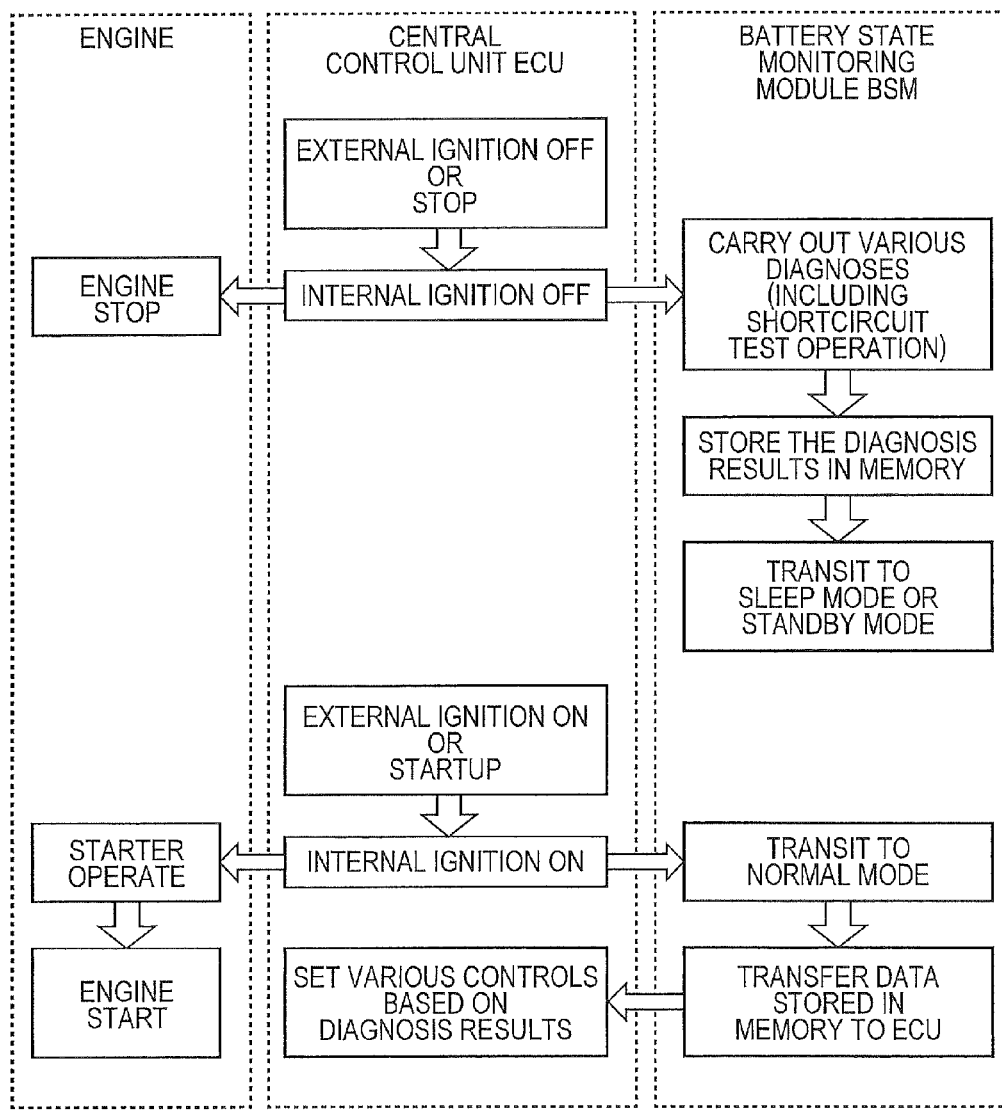
FIG. 21 is a flowchart for explaining an operation of a diagnosis processing in the vehicle system according to the third embodiment.

Then, FIG. 21 shows a flowchart for explaining an operation of the diagnosis processing in the vehicle system according to the third embodiment. As shown in FIG. 23, in the vehicle system according to the third embodiment, in response to the external ignition signal IGNe becoming in the disenabled state (e.g., an OFF state) or to the vehicle becoming in the stop state, the central control unit ECU sets the internal ignition signal IGNi to be in the disenabled state (e.g., the OFF state). Thereby, the engine stops. Moreover, the battery state monitoring module BSM carries out at least the short-circuit test operation and the current monitoring operation in response to the internal ignition signal IGNi becoming in the disenabled state. These short-circuit test operation and current monitoring operation are performed using the input control circuit 10 and the measurement part 20 of the semiconductor device 1 according to the first embodiment. Moreover, the battery state monitoring module BSM performs a diagnosis of the battery by the arithmetic circuit 41 according to the second embodiment based on the obtained measured value.

Then, the battery state monitoring module BSM stores the diagnostic result, for example, in memory of the arithmetic circuit 41, and subsequently moves to a sleep mode or a standby mode to reduce a consumption of electric power.

Following this, in a state where the vehicle stops, when a start operation is directed by the fact that the external ignition signal IGNe is in the enabled state, or by the accelerator signal ACC and the brake signal BRK, the central control unit ECU sets the internal ignition signal IGNi to be in the enabled state (e.g., the ON state). Thereby, a starter starts its operation to start the engine. Moreover, in response to the internal ignition signal IGNi becoming in the enabled state, the battery state monitoring module BSM transits from a low power consumption mode, such as a sleep mode, to a normal mode. Then, in response to transition to the normal mode, the battery state monitoring module BSM transmits data stored in the memory to the central control unit ECU. The central control unit ECU sets various controls based on the data received from the battery state monitoring module BSM. Setting of the controls includes, for example, a setting as to whether the idling stop function at the time of next stop will be operated or not.

From the above-mentioned explanation, the vehicle system according to the third embodiment can switch the idling stop function between being valid and being invalid based on the reliable diagnostic result by using the battery state monitoring module BSM that includes the input control circuit 10 and the measurement part 20 of the semiconductor device 1 according to the first embodiment. Moreover, the vehicle system according to the third embodiment can sufficiently use the idling stop function that works when deterioration of the battery BAT is recognized.

In the foregoing, although the invention made by the present inventors was specifically explained based on the embodiments, it goes without saying that the present invention is not limited to the embodiments already described and various modifications are possible within a range that does not deviate from its gist.

What is claimed is:

1. A semiconductor device, comprising:
   first and second external terminals coupled to power supply wiring that couples one end of a current detecting resistance and a power supply terminal of a battery;
   a third external terminal coupled to an other end of the current detecting resistance;
   a measurement part for measuring a voltage difference between the first external terminal and the second external terminal;
   a first resistance coupled between the second external terminal and the one end of the current detecting resistance;
   a first current source for outputting a first measurement current to the second external terminal;
   a second current source for outputting a second measurement current to the third external terminal; and
   a control circuit for controlling an output of the second measurement current destined to the third external terminal,
   wherein the first and second external terminals are coupled on a same side to the first resistance via an uninterrupted current path, and
   wherein the control circuit intercepts outputs of the first and the second measurement currents by the first and the second current sources in a current monitoring operation of measuring a current monitor voltage value that varies according to a current flowing through the current detecting resistance, and measures a voltage difference between the second external terminal and the third external terminal in the current monitoring operation.

2. The semiconductor device according to claim 1,
   wherein the control circuit makes the second measurement current smaller than the first measurement current in a first period when a first short-circuit test operation is performed, and makes a magnitude of the second measurement current larger than that of the first period in a second period when a second short-circuit test operation is performed, and
   wherein the first resistance has a different resistance than the current detecting resistance.

3. The semiconductor device according to claim 1, comprising:
   first internal wiring coupled to the first external terminal;
   second internal wiring coupled to the second external terminal;
   third internal wiring coupled to the third external terminal;
   fourth and fifth internal wiring coupled to the measurement part;
   a first switching circuit that couples the first internal wiring and the fourth internal wiring in the first and the second short-circuit test operations, and couples the second internal wiring and the fourth internal wiring in the current monitoring operation; and
   a second switching circuit that couples the second internal wiring and the fifth internal wiring in the first and the second short-circuit test operations, and couples the third internal wiring and the fifth internal wiring in the current monitoring operation.

4. The semiconductor device according to claim 1, wherein the control circuit has an operating state setting register for storing a setup value that specifics an operating state of the semiconductor device, and switches the short-circuit test operation including the first and the second short-circuit test operations and the current monitoring operation based on the setup value.

5. The semiconductor device according to claim 1, further comprising:
a capacitor that is coupled with a node disposed between the first resistance and the second external terminal,
wherein the first current source outputs the first measurement current to the first resistance coupled between the second external terminal and the power supply wiring,
wherein the second current source outputs the second measurement current to a second resistance coupled between the third external terminal and an other end of the current detecting resistance, and
wherein the first resistance and the second resistance have a higher resistance than the current detecting resistance.

6. The semiconductor device according to claim 1, wherein the control circuit has a measured value register for storing a measured value outputted by the measurement part for every operating state, and outputs the measured value stored in the measured value register at a request from a high-order system.

7. The semiconductor device according to claim 3, wherein the measurement part comprises a variable gain amplifier for amplifying a voltage difference inputted through the fourth and the fifth internal wiring and an analog-digital converter for converting an output value of the variable gain amplifier into a digital value and outputting the measured value, and
wherein the control circuit outputs a gain control signal for controlling an amplification factor of the variable gain amplifier.

8. The semiconductor device according to claim 1, wherein the current detecting resistance comprises a shunt resistance,
further comprising a second resistance coupled between the third external terminal and the other end of the shunt resistance, and
wherein the first resistance and the second resistance have a higher resistance than the shunt resistance.

9. The semiconductor device according to claim 1, wherein the battery comprises a lead battery.

10. A battery state monitoring module, comprising:
a battery state monitoring device including a current monitor voltage measurement circuit for measuring a current monitor voltage value that varies according to a current value flowing through a current detecting resistance coupled to a power supply terminal of a battery; and
an arithmetic circuit that determines a state of the battery based on the current monitor voltage value measured by the battery state monitoring device, and transmits the determination result at a request from a high-order system,
wherein the current monitor voltage measurement circuit includes:
first and second external terminals coupled to power supply wiring that couples one end of the current detecting resistance and the power supply terminal of the battery;

a third external terminal coupled to an other end of the current detecting resistance;
a measurement part for measuring a voltage difference between the first external terminal and the second external terminal;
a first resistance coupled between the second external terminal and the one end of the current detecting resistance;
a first current source for outputting a first measurement current to the second external terminal;
a second current source for outputting a second measurement current to the third external terminal; and
a control circuit for controlling an output of the second measurement current destined to the third external terminal,
wherein the first and second external terminals are coupled on a same side to the first resistance via an uninterrupted current path,
wherein the control circuit stops outputs of the first and the second measurement currents by the first and the second current sources, respectively, in a current monitoring operation of measuring the current monitor voltage value, and
wherein the measurement part measures a voltage difference between the second external terminal and the third external terminal in the current monitoring operation.

11. The battery state monitoring module according to claim 10,
wherein the control circuit makes the second measurement current smaller than the first measurement current in a first period when the first short-circuit test operation is performed, and makes a magnitude of the second measurement current larger than that of the first period in a second period when the second short-circuit test operation is performed.

12. The battery state monitoring module according to claim 10, comprising:
a filter circuit including:
a second resistance coupled between an other end of the current detecting resistance and the third external terminal.

13. The battery state monitoring module according to claim 10,
wherein the battery state monitoring device further comprises a monitor circuit for outputting at least a battery voltage value that varies according to a voltage of the battery and a battery environmental temperature value corresponding to a temperature of the battery, and
wherein the arithmetic circuit determines a state of the battery based on the current monitor voltage value, the battery voltage value, and the battery environmental temperature value.

14. The battery state monitoring module according to claim 10,
wherein the battery state monitoring module includes the current detecting resistance, and
wherein the current detecting resistance comprises a shunt resistance.

15. A vehicle system, comprising:
a battery state monitoring module including a battery state monitoring device for measuring a current monitor voltage value that varies according to a current value flowing through a current detecting resistance coupled to power supply terminals of a battery, and an arithmetic circuit that determines a state of the battery based on the current monitor voltage value measured by the battery state monitoring device and transmits the determination result at a request from a high-order system; and a central control unit for outputting an internal ignition signal that directs start and stop of an engine to an electronic load circuit for controlling the engine and a starter, wherein the battery state monitoring device carries out a short-circuit test operation for testing a short circuit state between two different external terminals coupled to two different ends of the current detecting resistance, and a current monitoring operation of measuring a current monitor voltage value that occurs between the two ends of the current detecting resistance, and wherein the central processing unit makes the engine move to a stop state by the internal ignition signal in response to a vehicle becoming in a stop state, also directs a diagnosis processing of the battery including the short-circuit test operation and the current monitoring operation to the battery state monitoring device, and when making the vehicle move from the stop state to a run state, makes the starter and the engine start by the internal ignition signal and also receives a result of the diagnosis processing of the battery, wherein the battery state monitoring device includes:
- first and second external terminals coupled to power supply wiring that couples one end of the current detecting resistance and the power supply terminal of the battery;
- a third external terminal coupled to an other end of the current detecting resistance;
- a measurement part for measuring a voltage difference between the first external terminal and the second external terminal;
- a first resistance coupled between the second external terminal and a first end of the two different ends of the current detecting resistance;
- a first current source for outputting a first measurement current to the second external terminal;
- a second current source for outputting a second measurement current to the third external terminal; and
- a control circuit for controlling an output of the second measurement current destined to the third external terminal, wherein the first and second external terminals are coupled on a same side to the first resistance via an uninterrupted current path, wherein the control circuit stops outputs of the first and the second measurement currents by the first and the second current sources, respectively, in a current monitoring operation of measuring the current monitor voltage value, and wherein the measurement part measures a voltage difference between the second external terminal and the third external terminal in the current monitoring operation.

16. The vehicle system according to claim 15,
wherein the battery state monitoring device further includes a monitor circuit for outputting at least a battery voltage value that varies according to the voltage of the battery and a battery environmental temperature value corresponding to a temperature of the battery, and
wherein the arithmetic circuit determines the state of the battery based on the current monitor voltage value, the battery voltage value, and the battery environmental temperature value.

17. The vehicle system according to claim 15,
wherein when the result of the diagnosis processing indicates that an ability of the battery is insufficient for engine restart, the central control unit maintains the engine in an operating state regardless of a state of the vehicle during a period until an external ignition signal inputted from the outside indicates that the vehicle moves to the stop state.

* * * * *